(12) United States Patent
Lin

(10) Patent No.: US 12,482,735 B2
(45) Date of Patent: Nov. 25, 2025

(54) SEMICONDUCTOR PACKAGE INCLUDING A SURFACE WITH A PLURALITY OF ROUGHNESS VALUES AND METHODS OF FORMING THE SAME

(71) Applicant: Taiwan Semiconductor Manufacturing Company Limited, Hsinchu (TW)

(72) Inventor: Wei-Hung Lin, Xinfeng Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 622 days.

(21) Appl. No.: 17/898,499

(22) Filed: Aug. 30, 2022

(65) Prior Publication Data
US 2024/0071890 A1   Feb. 29, 2024

(51) Int. Cl.
*H01L 23/498*   (2006.01)
*H01L 21/48*   (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ........... H01L 23/49838; H01L 21/4853; H01L 21/4857; H01L 21/563; H01L 23/49816;
(Continued)

(56) References Cited

U.S. PATENT DOCUMENTS 6,288,451 B1 *   9/2001   Tsao ........................ H01L 23/13
                                                                361/720
10,756,054 B1 *   8/2020   Huang .................. H01L 21/568
(Continued)

FOREIGN PATENT DOCUMENTS

| JP | 2003249601 A | 9/2003 |
|----|--------------|--------|
| JP | 2005123547 A | 5/2005 |
| JP | 2016219530 A | 12/2016 |
| TW | 202008533 A | 2/2020 |

OTHER PUBLICATIONS

JP Patent and Trademark Office; JP Application No. 2023-101639; Notice of Reason(s) for Refusal, Office Action mailed Jul. 5, 2024; 6 pages.
(Continued)

*Primary Examiner* — Michael Jung
(74) *Attorney, Agent, or Firm* — The Marbury Law Group, PLLC

(57) ABSTRACT

A semiconductor package includes a package substrate including an upper surface layer including a first surface area having a first surface roughness, and a second surface area having a second surface roughness less than the first surface roughness, and an interposer module mounted on the upper surface layer of the package substrate in the second surface area. The semiconductor package may also include an interposer including an upper surface layer including a first surface area having a first surface roughness, and a second surface area having a second surface roughness less than the first surface roughness. The semiconductor package may also include an printed circuit board substrate including an upper surface layer including a first surface area having a first surface roughness, and a second surface area having a second surface roughness less than the first surface roughness.

20 Claims, 20 Drawing Sheets

(51) Int. Cl.
*H01L 21/56* (2006.01)
*H01L 23/00* (2006.01)
*H01L 25/065* (2023.01)

(52) U.S. Cl.
CPC ...... *H01L 21/563* (2013.01); *H01L 23/49816* (2013.01); *H01L 23/49822* (2013.01); *H01L 23/49833* (2013.01); *H01L 23/49894* (2013.01); *H01L 23/562* (2013.01); *H01L 24/16* (2013.01); *H01L 24/32* (2013.01); *H01L 24/73* (2013.01); *H01L 25/0655* (2013.01); *H01L 2224/16227* (2013.01); *H01L 2224/16238* (2013.01); *H01L 2224/32225* (2013.01); *H01L 2224/73204* (2013.01); *H01L 2924/1431* (2013.01); *H01L 2924/1436* (2013.01)

(58) Field of Classification Search
CPC ......... H01L 23/49833; H01L 23/49894; H01L 23/562; H01L 24/16; H01L 24/32; H01L 24/73; H01L 25/0655
See application file for complete search history.

(56) References Cited

U.S. PATENT DOCUMENTS

| | | | |
|---|---|---|---|
| 2008/0245549 A1* | 10/2008 | Kodani | H05K 3/4679 |
| | | | 174/126.1 |
| 2011/0042797 A1 | 2/2011 | Park et al. | |
| 2012/0119358 A1* | 5/2012 | Oh | H01L 23/3142 |
| | | | 257/737 |
| 2018/0096919 A1* | 4/2018 | Roth | H01L 24/97 |
| 2019/0206761 A1* | 7/2019 | Nomura | C23F 4/02 |
| 2022/0037229 A1 | 2/2022 | Chen et al. | |
| 2022/0225503 A1* | 7/2022 | Tanaka | H05K 3/4007 |
| 2022/0230912 A1 | 7/2022 | Kim et al. | |
| 2024/0006380 A1* | 1/2024 | Nad | H01L 21/4857 |

OTHER PUBLICATIONS

TW Patent and Trademark Office; TW Application No. 112130394; Office Action mailed Dec. 23, 2024; 14 pages.
TW Patent and Trademark Office; TW Application No. 112130394 Office Action mailed Jul. 3, 2024; 14 pages.

\* cited by examiner

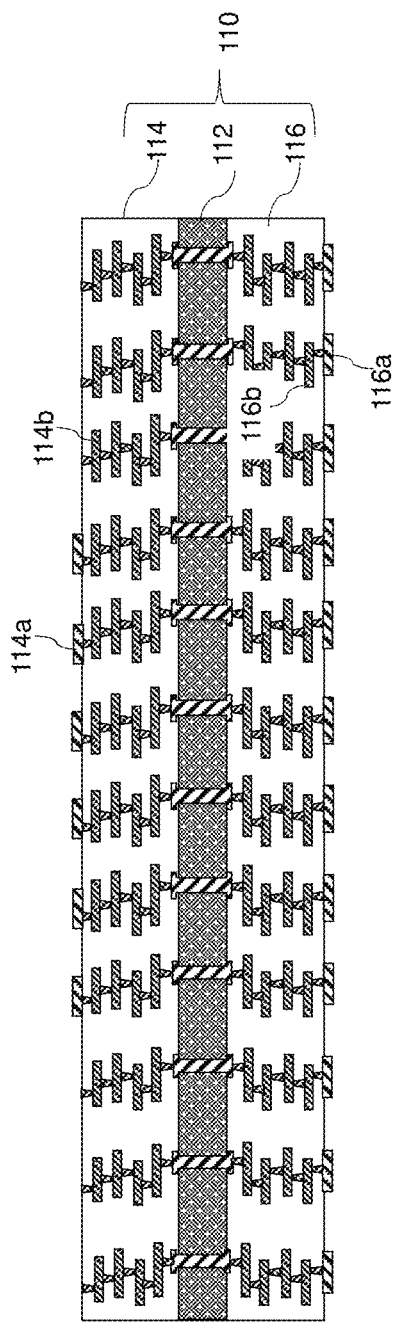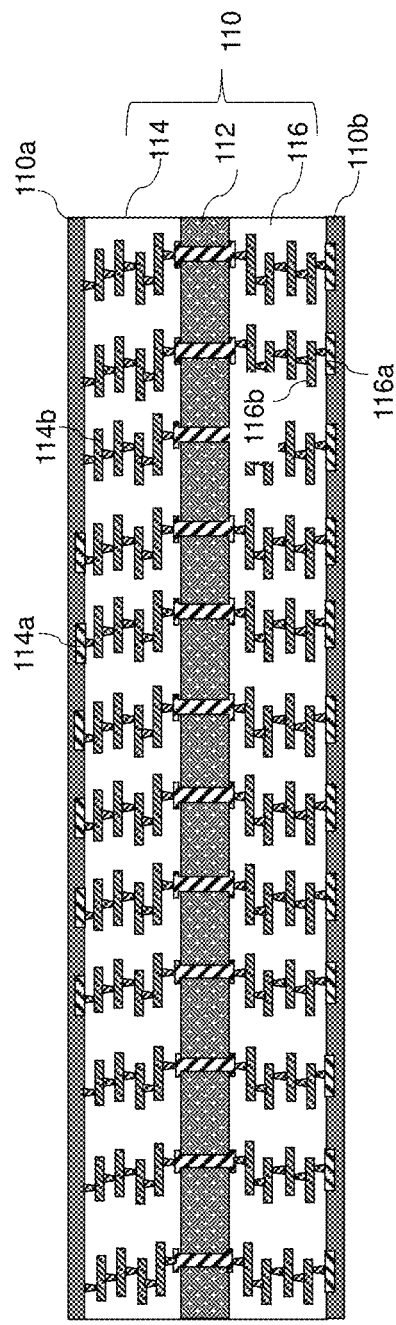
FIG. 2A
FIG. 2B

SEMICONDUCTOR PACKAGE INCLUDING A SURFACE WITH A PLURALITY OF ROUGHNESS VALUES AND METHODS OF FORMING THE SAME

BACKGROUND

A typical semiconductor package may include an interposer module mounted on a package substrate. The interposer module may include one or more semiconductor devices (e.g., semiconductor dies) mounted on an interposer. The semiconductor package may also be mounted on a printed circuit board (PCB). In each case, an underfill material may be formed on a substrate surface (e.g., a surface of the package substrate, a surface of the interposer, or a surface of the PCB) and between the substrate surface and the item being mounted on the substrate surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a vertical cross-sectional view of an exemplary intermediate structure including the package substrate upper bonding pads and the package substrate lower bonding pads, according to one or more embodiments.

FIG. 2B is a vertical cross-sectional view of an exemplary intermediate structure including the package substrate upper surface layer and package substrate lower surface layer, according to one or more embodiments.

DETAILED DESCRIPTION

Figure 1A:
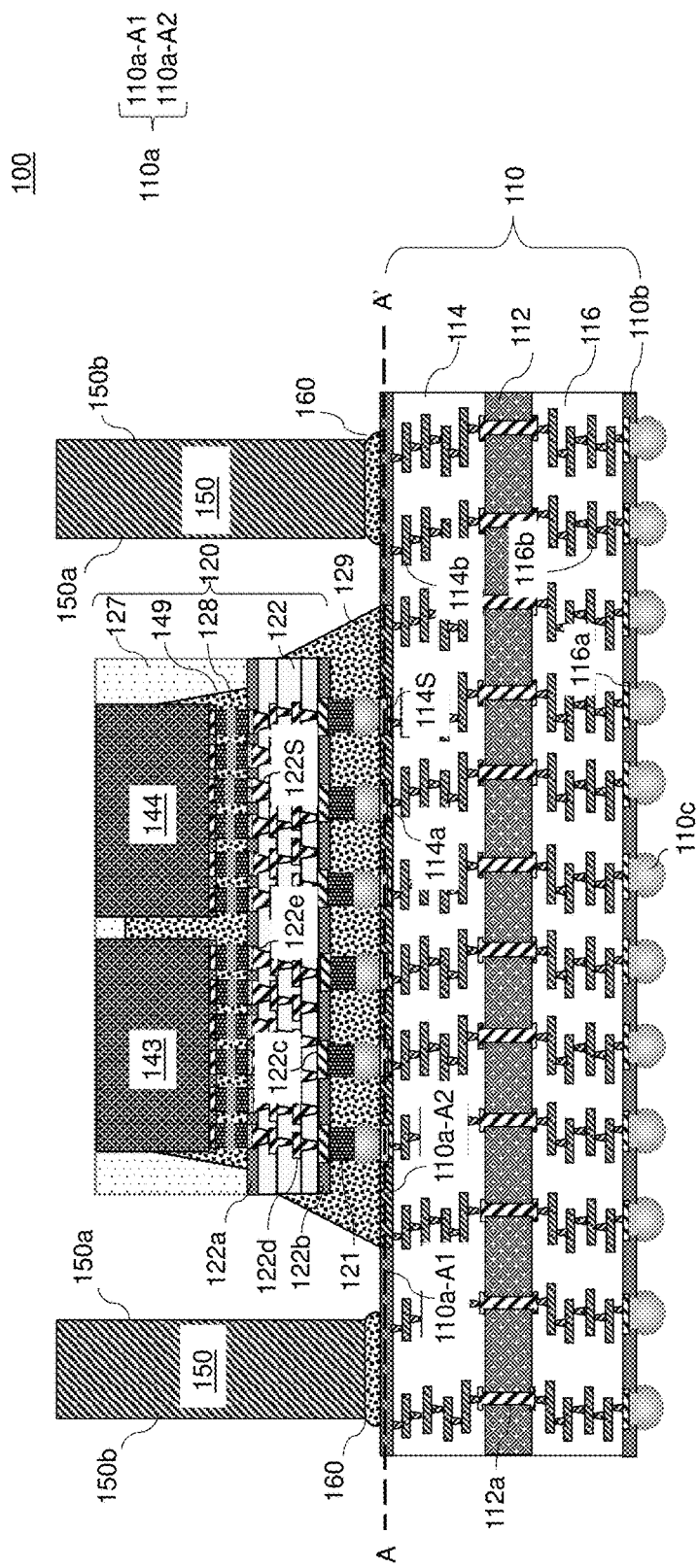
FIG. 1A is a vertical cross-sectional view of a semiconductor package according to one or more embodiments along line BB' in FIG. 1B.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A typical semiconductor structure (e.g., standard semiconductor package or interposer module) may include a substrate having a surface with a single surface roughness. The typical semiconductor structure may be formed, for example, include, by flip chip bonding a semiconductor die placed on a substrate (e.g., flip chip bonding), reflowing underfill material (underfill filling) between the die and substrate, and performing an inspection (e.g., scanning acoustic tomography (SAT) inspection).

In a typical semiconductor structure a problem may arise in that an underfill material formed on the substrate surface (e.g., underfill material formed a surface of the package substrate, a surface of the interposer, or a surface of the PCB) may have a slow flow speed. The slow flow speed may cause a non-uniform flow striation in the underfill material. The slow flow speed may also result in the formation of one or more voids in the underfill material.

It has been determined that substrate surface roughness can impact underfill flow performance and the risk of underfill (UF) void formation. In particular, substrate surface roughness may affect underfill flow and underfill voids in a flip chip ball grid array (FCBGA) package.

One or more embodiments disclosed herein may include a novel substrate structure for underfill filling enhancement. The novel substrate structure may include a hybrid surface roughness in a dedicated region. The various embodiments that include a novel substrate structure may provide better underfill flow and filling performance by constructing areas having different surface roughness values (e.g., in a substrate or interposer).

In contrast to typical semiconductor structures that include a substrate having a single surface roughness, one or more embodiments disclosed herein may include a semiconductor structure (e.g., a semiconductor package including integrated fan-out on substrate (InFO_oS), chip-on-wafer-on-substrate (CoWoS®), system on integrated chips (SoIC) package, etc.) having a hybrid surface roughness in a dedicated region. In one or more embodiments, a surface of the substrate may include a solder resist layer having a different roughness surface finish from other surfaces of the substrate. In one or more embodiments, a surface of an interposer (e.g., silicon/organic/glass interposer) may include a different roughness surface finish from other surfaces of the substrate. In particular, one or more embodiments may include a bump joint area with a smooth surface roughness (second surface roughness R2) and no component joint area with a rough surface roughness (first surface roughness R1).

In one or more embodiments, a surface of a substrate may include two or more surface areas (N) (e.g., N≥2) having different roughness values R (e.g., R1, R2) from other surfaces of the substrate.

In particular, various surfaces of a substrate may include a first roughness (R1) providing a flow bleeding barrier for underfill process, and a second roughness (R2) providing a better flow surface for underfill process. A value of the first surface roughness R1 may be greater than about 1.5 times a value of the second surface roughness R2.

A roughness value may include, for example, arithmetical mean roughness (Ra), ten-point mean roughness (Rz), and Rq is the root-mean-square (rms) value of the departures of the profile from the mean line, and/or maximum height or depth (Rmax). However, other measures of roughness may be within the scope of disclosure (e.g., mean spacing of profile irregularities (Sm), mean spacing of local peaks of the profile(S), and profile bearing length ratio (tp)). A value of surface roughness may be determined, for example, by measuring a surface roughness in a randomly sampled area. In particular, a difference between the first surface roughness R1 and the second surface roughness R2 may be measured, for example, in a transition area of underfill bleeding.

One or more embodiments may have several advantages and benefits. For example, a smooth surface roughness may provide the better condition for underfill flow, which can result in less flow striation and lower a risk of an underfill void. Further, the dedicated area with a different surface roughness (e.g., bump joint area) can constrain an underfill bleeding area. One or more embodiments may be applicable for multiple technology generations (N16, N10, N7, etc.), and can be expanded to other applications (e.g. hard mask (HM) etch for other layers), and for silicon chip, InFO_oS, CoWoS®, and SoIC bump joint schemes. Thus, the flow of underfill material may be controlled by varying surface roughness values of different surfaces of the substrate.

Further, an area of smooth surface roughness (Area$_{R2}$) may be controlled by process setting and the configuration setting to be in a range from about 10% of a total surface area (of the substrate surface) to about 90% of a total surface area (Area$_{R2}$: 10%~90% Area$_{Total}$). A number of areas with a smooth surface roughness (Area$_{R2}$) is not limited in each unit substrate or interposer as long as it may be afforded within the total surface area (N×Area$_{R2}$: <Area$_{Total}$). The area of smooth surface roughness (Area$_{R2}$) may provide a constrained boundary for underfill flow out area (e.g., bleeding). The wetting of underfill material with a substrate (e.g., package substrate or interposer) with different surface roughness values may provide various bleeding performances.

A method of forming a semiconductor package may include, for example, coating or laminating a substrate surface layer. The substrate surface layer may include any surface layer including, for example, a solder resist (SR), polybenzobisoxazole (PBO), or polyimide (PI), coated or laminated on a package substrate, interposer, etc. A first surface area having the first surface roughness may then be formed by 1) using a descum (e.g., desmear) plasma treatment with a shielding mask in the dedicated area, or 2) by pressing by customized mold in the dedicated area.

FIG. 1A is a vertical cross-sectional view of a semiconductor package 100 according to one or more embodiments. In particular, FIG. 1A is a vertical cross-sectional view of the semiconductor package 100 along the cross-section B-B' in FIG. 1B.

Generally, the semiconductor package 100 may include a package substrate 110, an interposer module 120 on the package substrate 110, and a stiffener ring 150 adhered and/or affixed to the package substrate 110 adjacent to the interposer module 120. The stiffener ring 150 may include an inner edge 150a and an outer edge 150b. In at least one embodiment, the interposer module 120 may be replaced with one or more semiconductor chips or chiplets.

The package substrate 110 may include, for example, a core 112, a package substrate upper dielectric layer 114 formed on the core 112 (e.g., a first side or chip-side of the package substrate 110), and a package substrate lower dielectric layer 116 formed on the core 112 (e.g., a second side or board-side of the package substrate 110). In particular, the package substrate 110 may include a build-up film substrate such as an Ajinomoto build-up film (ABF) substrate. That is, in at least one embodiment, each of the package substrate upper dielectric layer 114 and the package substrate lower dielectric layer 116 may be described as an ABF layer.

The core 112 may help to provide rigidity to the package substrate 110. The core 112 may include, for example, an epoxy resin such as a bismaleimide triazine epoxy (BT epoxy) and/or a woven glass laminate. The core 112 may alternatively or in addition include an organic material such as a polymer material. In particular, the core 112 may include a dielectric polymer material such as polyimide (PI), benzocyclo-butene (BCB), or polybenzobisoxazole (PBO). Other suitable dielectric materials are within the contemplated scope of disclosure.

The core 112 may include one or more through vias 112*a*. The one or more through vias 112*a* may extend from a lower surface of the core 112 to an upper surface of the core 112. The one or more through vias 112*a* may allow an electrical connection between the package substrate upper dielectric layer 114 and the package substrate lower dielectric layer 116. The one or more through vias 112*a* may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

The package substrate lower dielectric layer 116 may include a plurality of layers and, in particular, may include a build-up film (e.g., ABF). The package substrate lower dielectric layer 116 may include an organic material such as a polymer material. In particular, the package substrate lower dielectric layer 116 may include one or more layers of dielectric polymer material such as polyimide (PI), benzocyclobutene (BCB), or polybenzobisoxazole (PBO). Other suitable dielectric materials are within the contemplated scope of disclosure.

The package substrate lower dielectric layer 116 may include one or more package substrate lower bonding pads 116*a* on a board-side surface of the package substrate lower dielectric layer 116. In particular, the package substrate lower bonding pads 116*a* may be exposed on the board-side surface of the package substrate lower dielectric layer 116. The package substrate lower dielectric layer 116 may also include one or more metal interconnect structures 116*b*. The metal interconnect structures 116*b* may be connected to the package substrate lower bonding pads 116*a* and the through vias 112*a* in the core 112. The metal interconnect structures 116*b* may include metal layers (e.g., copper traces) and metal vias connecting the metal layers. The package substrate lower bonding pads 116*a* and the metal interconnect structures 116*b* may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

A package substrate lower surface layer 110*b* may be formed on the board-side surface of the package substrate lower dielectric layer 116. The package substrate lower surface layer 110*b* may partially cover the package substrate lower bonding pads 116*a*. The package substrate lower surface layer 110*b* may include one or more of a passivation layer and protection layer. The package substrate lower surface layer 110*b* may include, for example, a dielectric polymer material such as polyimide (PI), benzocyclobutene (BCB), or polybenzobisoxazole (PBO). The package substrate lower surface layer 110*b* may alternatively or additionally include silicon oxide, silicon nitride, low-k dielectric materials such as carbon-doped oxides, extremely low-k dielectric materials such as porous carbon doped silicon dioxide, or a combination thereof. Other suitable dielectric materials are within the contemplated scope of disclosure.

A ball-grid array (BGA) including a plurality of solder balls 110*c* may be formed on the board-side surface of the package substrate lower dielectric layer 116. The solder balls 110*c* may allow the semiconductor package 100 to be securely mounted on a substrate such as a printed circuit board (PCB) and electrically coupled to the PCB substrate. The solder balls 110*c* may contact the package substrate lower bonding pads 116*a*, respectively.

The package substrate upper dielectric layer 114 may be formed on an upper surface of the core 112. The package substrate upper dielectric layer 114 may also include a plurality of layers and, in particular, may include a build-up film (e.g., ABF). The package substrate upper dielectric layer 114 may also include an organic material such as a polymer material. In particular, the package substrate upper dielectric layer 114 may include a dielectric polymer material such as polyimide (PI), benzocyclobutene (BCB), or polybenzobisoxazole (PBO). Other suitable dielectric materials are within the contemplated scope of disclosure.

The package substrate upper dielectric layer 114 may include one or more package substrate upper bonding pads 114*a* on a chip-side surface of the package substrate upper dielectric layer 114. In particular, the package substrate upper bonding pads 114*a* may be exposed on the chip-side surface of the package substrate upper dielectric layer 114. In at least one embodiment, a bonding pad surface layer 114S (e.g., one or more layers of metals (e.g., tin, nickel, palladium, gold, etc.) and/or other materials) may be formed on the package substrate upper bonding pads 114*a* to improve solder joint reliability.

The package substrate upper dielectric layer 114 may also include one or more metal interconnect structures 114*b*. The metal interconnect structures 114*b* may include metal layers (e.g., copper traces) and metal vias connecting the metal layers. The package substrate upper bonding pads 114*a* may be electrically connected to the solder balls 110*c* of the BGA by way of the metal interconnect structures 114*b*, the through vias 112*a*, the metal interconnect structures 116*b*, and the package substrate lower bonding pads 116*a*. The package substrate upper bonding pads 114*a* and the metal interconnect structures 114*b* may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

A package substrate upper surface layer 110*a* may be formed on the chip-side surface of the package substrate upper dielectric layer 114. The package substrate upper surface layer 110*a* may including a coating layer, laminate layer, etc. The package substrate upper surface layer 110*a* may be formed so as to at least partially cover the package substrate upper bonding pads 114*a*.

In at least one embodiment, the package substrate upper surface layer 110*a* may include a solder resist layer (e.g., solder mask layer). The solder resist layer may include a thin layer of polymer material (e.g., epoxy polymer). The solder resist layer may have a thickness in a range from about 5 µm to 50 µm. In at least one embodiment, the solder resist layer may have a thickness in a range from about 10 µm to 30 µm. Greater or lesser thickness of the solder resist layer may be used. The solder resist layer may be formed so as to cover the package substrate upper bonding pads 114*a* and other metal features (e.g., conductive lines, copper traces) on the chip-side surface of the package substrate 110. The solder resist layer may protect the package substrate upper bonding pads 114a and other metal features from oxidation. The solder resist layer may also prevent solder bridges (e.g., unintended electrical connections) from forming between closely spaced metal features. The solder resist layer may include solder resist openings (SROs) over the package substrate upper bonding pads 114a, respectively. An upper surface of the package substrate upper bonding pads 114a may be exposed through the SROs. The SROs may have a tapered sidewall so that a diameter of the SRO (in the X-Y plane) may decrease in a direction toward the package substrate upper bonding pad 114a.

The package substrate upper surface layer 110a may alternatively or additionally a layer other than a solder resist layer, such as a passivation layer or protection layer. In particular, the package substrate upper surface layer 110a may alternatively or additionally include a dielectric polymer material such as polyimide (PI), benzocyclo-butene (BCB), or polybenzobisoxazole (PBO), silicon oxide, silicon nitride, low-k dielectric materials such as carbon-doped oxides, extremely low-k dielectric materials such as porous carbon doped silicon dioxide, a combination thereof or other suitable material. The package substrate upper surface layer 110a may alternatively or additionally be formed, for example, by chemical vapor deposition (CVD), physical vapor deposition (PVD), spin coating, lamination or other suitable deposition technique.

As illustrated in FIG. 1A, the package substrate upper surface layer 110a may include a first surface area 110a-A1 ($Area_{R1}$) and a second surface area 110a-A2 ($Area_{R2}$). The first surface area 110a-A1 may having first surface roughness R1. The second surface area 110a-A2 may have a second surface roughness R2 that is less than the first surface roughness R1. In at least one embodiment, the first surface roughness R1 may be at least 1.5 times the second surface roughness R2. The first surface roughness R1 and second surface roughness R2 may include, for example, arithmetical mean roughness (Ra), ten-point mean roughness (Rz), and Rq is the rms root-mean-square (rms) value of the departures of the profile from the mean line, and/or maximum height or depth (Rmax). However, other measures of roughness may be within the scope of disclosure. In at least one embodiment, the second surface roughness R2 may include an arithmetical mean roughness Ra (nm, Avg.) of less than about 170. The first surface roughness R1 and second surface roughness R2 may be measured, for example, in a randomly sampled area near to an interface between the first surface area 110a-A1 and the second surface area 110a-A2 (e.g., a transition area of underfill bleeding).

The interposer module 120 may be mounted by C4 bumps 121 (e.g., solder joints) on the package substrate upper bonding pads 114a in the package substrate 110. A package underfill layer 129 may be formed under and around the interposer module 120 and the C4 bumps 121 so as to fix the interposer module 120 to the package substrate 110. The package underfill layer 129 may have a low viscosity (e.g., less than about 5,000 cP at 10 rpm), and may be formed of an epoxy-based polymeric material. In at least one embodiment, the package underfill layer 129 may include a capillary underfill including a mixture of epoxy and silica. In at least one embodiment, the package underfill layer 129 may include a low-viscosity suspension of silica in prepolymer.

As further illustrated in FIG. 1A, the package substrate upper surface layer 110a may include a hybrid surface roughness (e.g., a plurality of different values of surface roughness) in a dedicated region (e.g., a region in and around an area of mounting the interposer module 120). The hybrid surface roughness of the package substrate upper surface layer 110a may enhance the qualities of the package underfill layer 129. The hybrid surface roughness may provide better underfill flow and filling performance by constructing areas having different surface roughness values (e.g., in a substrate or interposer). In particular, the second surface area 110a-A2 of the package substrate upper surface layer 110a may include a bump joint area (e.g., an area where the C4 bumps 121 are connected to the package substrate upper bonding pads 114a). The first surface area 110a-A1 of the package substrate upper surface layer 110a may include no component joint area (e.g., an area where no C4 bumps 121 are located).

It should be noted that although only one second surface area 110a-A2 is illustrated in FIG. 1A, the semiconductor package 100 may include any number of second surface areas 110a-A2. In addition, those second surface areas 110a-A2 may have the same or different roughness values. That is, the package substrate 100 may include a first interposer module 120' (not shown) on a second surface area 110a-A2' and a second surface roughness R2', and a first interposer module 120" (not shown) on a second surface area 110a-A2" and a second surface roughness R2" different than the second surface roughness R2'.

The hybrid surface roughness of the package substrate upper surface layer 110a may provide the semiconductor package 100 with several advantages and benefits. For example, the second surface roughness R2 (e.g., smooth surface roughness) may provide the better condition for flowing the package underfill layer 129 which can result in less flow striation and lower a risk of a void in the package underfill layer 129. Further, the second surface area 110a-A2 (e.g., bump joint area) may constrain a bleeding of the package underfill layer 129 (e.g., provide a constrained boundary for underfill flow out area (e.g., bleeding)). That is, an underfill bleeding area may not extend beyond the outer edge (e.g., perimeter) of the second surface area 110a-A2.

A size of the second surface area 110a-A2 may be controlled, for example, to be in a range from about 10% of a total surface area of the package substrate upper surface layer 110a ($Area_{Total}$) to about 90% of a total surface area of the package substrate upper surface layer 110a ($0.10\, Area_{Total} \leq Area_{R2} \leq 0.90\, Area_{Total}$). A number (N) of the second surface areas 110a-A2 is not limited as long as the number can be afforded within the total surface area ($N \times Area_{R2} < Area_{Total}$).

Referring again to FIG. 1A, the interposer module 120 may include an interposer 122 (e.g., interposer dielectric) which may include an organic material (e.g., dielectric polymer) or inorganic material (e.g., silicon, glass, etc.). In particular, as illustrated in FIG. 1A, the interposer 122 may include a plurality of layers (e.g., dielectric polymer layers, silicon layers, etc.). The interposer module 120 may further include an interposer lower surface layer 122b that may be similar to the package substrate lower surface layer 110b. The interposer module 120 may also include interposer lower bonding pads 122c in the interposer lower surface layer 122b. The interposer lower bonding pads 122c may be similar to the package substrate lower bonding pads 116a.

In at least one embodiment the interposer lower surface layer 122b may also include a surface roughness that is substantially equal to or less than the second surface roughness R2. This may help to improve a flow of the package underfill material between the interposer module 120 and the package substrate 110.

The interposer module 120 may also include metal interconnect structures 122d electrically connected to the C4 bumps 121 through the interposer lower bonding pads 122c. The metal interconnect structures 122d may be similar to the metal interconnect structures 114b and the metal interconnect structures 116b in the package substrate 110. The interposer module 120 may also include interposer upper bonding pads 122e on an upper surface of the interposer 122. The interposer upper bonding pads 122e may be similar to the package substrate upper bonding pads 114a. In at least one embodiment, a bonding pad surface layer 122S (e.g., one or more layers of metals (e.g., tin, nickel, palladium, gold, etc.) and/or other materials) may be formed on the interposer upper bonding pads 122e to improve solder joint reliability. The interposer 122 may also include an interposer upper surface layer 122a (e.g., solder resist layer) that may be formed around the interposer upper bonding pads 122e. The interposer upper surface layer 122a may be similar to the package substrate upper surface layer 110a.

The interposer module 120 may also include one or more semiconductor dies (e.g., semiconductor chips) mounted on the interposer 122. In particular, as illustrated in FIG. 1A, a first semiconductor die 143 and second semiconductor die 144 may be mounted on the interposer 122. The first semiconductor die 143 and second semiconductor die 144 may be mounted on the interposer 122, for example, by micro-bumps 128 (e.g., solder joints) that may be electrically connected to the metal interconnects 122d in the interposer 122.

Each of the first semiconductor die 143 and second semiconductor die 144 may include, for example, a semiconductor die, a system on chip (SOC) die, a system on integrated chips (SoIC) die, a high-bandwidth memory (HBM) die and a dynamic random access memory (DRAM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

An interposer underfill layer 149 may be formed around the micro-bumps 128 and between the first semiconductor die 143 and the interposer 122 and between the second semiconductor die 144 and the interposer 122. The interposer underfill layer 149 may be formed continuously under both of the first semiconductor die 143 and second semiconductor die 144. Alternatively, the interposer underfill layer 149 may be formed as two separate portions under the first semiconductor die 143 and second semiconductor die 144, respectively. The interposer underfill layer 149 may also be formed between first semiconductor die 143 and the second semiconductor die 144. The interposer underfill layer 149 may also be formed of an epoxy-based polymeric material.

A molding material layer 127 may be formed over the first semiconductor die 143, the second semiconductor die 144, the interposer underfill layer 149 and the interposer 122. The molding material layer 127 may be formed of an epoxy molding compound (EMC).

The stiffener ring 150 may mounted on the package substrate 110 around the interposer module 120. The stiffener ring 150 may be securely fixed to the package substrate 110 by an adhesive 160 (e.g., a silicone adhesive or an epoxy adhesive). The stiffener ring 150 may be formed of a metal such as copper with a nickel coating, or an aluminum alloy. The stiffener ring 150 may provide rigidity to the package substrate 110.

Figure 1B:
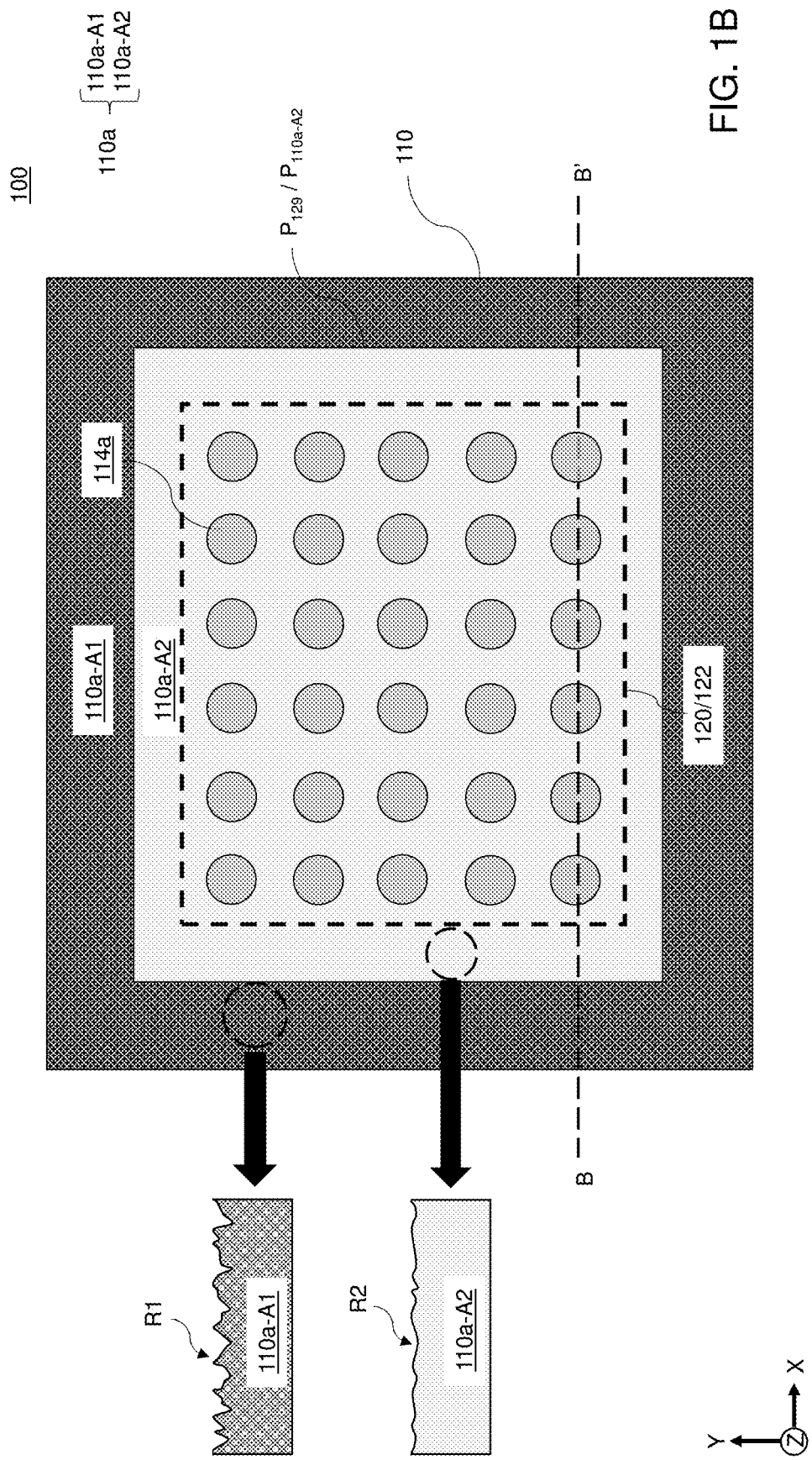
FIG. 1B is a horizontal cross-sectional view of the semiconductor package according to one or more embodiments along line AA' in FIG. 1A.

FIG. 1B is a horizontal cross-sectional view of the semiconductor package 100 according to one or more embodiments along line AA' in FIG. 1A. Some elements of the semiconductor package 100 including the interposer module 120, stiffener ring 150 and package underfill layer 129 are not shown or are shown only by dotted lines in FIG. 1B for ease of explanation.

As illustrated in FIG. 1B, the first surface area 110a-A1 of the package substrate upper surface layer 110a may be formed around an entire outer perimeter (e.g., edge) $P_{110a-A2}$ of the second surface area 110a-A2 of the package substrate upper surface layer 110a. The second surface area 110a-A2 may have a width in the x-direction that is greater than a width of the interposer 122 in the x-direction. The second surface area 110a-A2 may also have a width in the y-direction that is greater than a width of the interposer module 120 and interposer 122 in the y-direction. In addition, the outer perimeter (e.g., edge) $P_{129}$ of the package underfill layer 129 may be substantially coextensive with the outer perimeter $P_{110a-A2}$ of the second surface area 110a-A2. It should be noted that any number of interposer modules 120 may be mounted in the second surface area 110a-A2.

FIGS. 2A-2I illustrate a method of forming the semiconductor package 100 according to one or more embodiments.

FIG. 2A is a vertical cross-sectional view of an exemplary intermediate structure including the package substrate upper bonding pads 114a and the package substrate lower bonding pads 116a, according to one or more embodiments. The package substrate upper bonding pads 114a may be formed, for example, on an uppermost dielectric layer of the package substrate upper dielectric layer 114. The package substrate upper bonding pads 114a may be formed so as to contact the metal interconnect structures 114b. The package substrate upper bonding pads 114a may be formed by depositing a metal layer (e.g., copper, aluminum or other suitable conductive materials) on the uppermost dielectric layer of the package substrate upper dielectric layer 114. The metal layer may then be patterned by etching (e.g., by wet etching, dry etching, etc.) so as to form the package substrate upper bonding pads 114a. Other suitable metal layer materials and etching process may be with in the contemplated scope of disclosure.

The package substrate lower bonding pads 116a may be formed, for example, on a lowest dielectric layer of the package substrate lower dielectric layer 116. The package substrate lower bonding pads 116a may be formed so as to contact the metal interconnect structures 116b. The package substrate lower bonding pads 116a may be formed by depositing a metal layer (e.g., copper, aluminum or other suitable conductive materials) on the lowest dielectric layer of the package substrate upper dielectric layer 114. The metal layer may then be patterned by etching (e.g., by wet etching, dry etching, etc.) so as to form the package substrate lower bonding pads 116a.

After formation, the package substrate upper bonding pads 114a and package substrate lower bonding pads 116a may optionally undergo a surface roughening treatment (e.g., CZ treatment). In the surface roughening treatment, a surface of the package substrate upper bonding pads 114a (e.g., a copper surface) and surface of the package substrate lower bonding pads 116a (e.g., a copper surface) may be etched by an organic acid-type microetching solution, to create a super-roughened surface (e.g., copper surface). The uniquely-roughened copper surface topography of the package substrate upper bonding pads 114a and package substrate lower bonding pads 116a may help to achieve a high copper-to-resin adhesion.

FIG. 2B is a vertical cross-sectional view of an exemplary intermediate structure including the package substrate upper surface layer 110a and package substrate lower surface layer 110b, according to one or more embodiments. In at least one embodiment, the package substrate upper surface layer 110a may include a solder resist layer (e.g., polymer material), also referred to as a solder mask. The package substrate upper surface layer 110a may also be referred to as the upper solder resist layer 110a, and the package substrate lower surface layer 110b may also be referred to as the lower solder resist layer 110b.

The package substrate upper surface layer 110a and package substrate lower surface layer 110b may be applied concurrently. The package substrate upper surface layer 110a and package substrate lower surface layer 110b may be applied, for example, as a liquid photo-imageable film. The liquid photo-imageable film can be applied, for example, by silk-screening or spraying the liquid photo-imageable film onto the surface of the package substrate 110. The liquid photo-imageable film may be applied over the package substrate upper bonding pads 114a and the package substrate lower bonding pads 116a. The package substrate upper surface layer 110a and package substrate lower surface layer 110b may alternatively be applied as a dry-film photo-imageable film that may be vacuum-laminated onto the surface of the package substrate 110 and over the package substrate upper bonding pads 114a and the package substrate lower bonding pads 116a, respectively.

The package substrate upper surface layer 110a and package substrate lower surface layer 110b may be applied so as to have a thickness that is slightly greater than a thickness of the package substrate upper bonding pads 114a and the package substrate lower bonding pads 116a, respectively. Alternatively, the package substrate upper surface layer 110a and package substrate lower surface layer 110b may be applied so as to have an upper surface that is substantially co-planar with an upper surface of the package substrate upper bonding pads 114a and the package substrate lower bonding pads 116a, respectively.

Figure 2C:
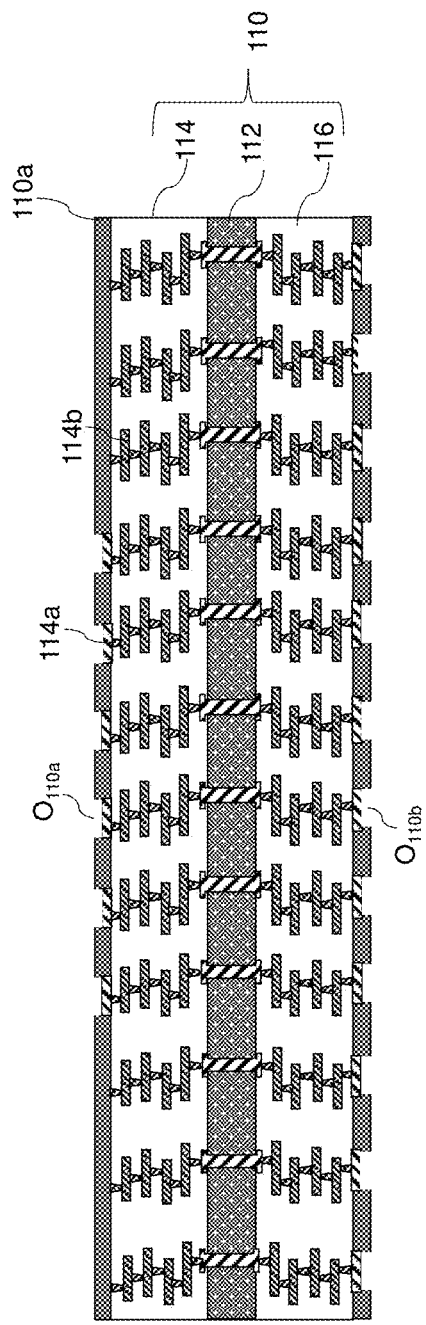
FIG. 2C is a vertical cross-sectional view of an exemplary intermediate structure including openings in the package substrate upper surface layer and openings in package substrate lower surface layer, according to one or more embodiments.

FIG. 2C is a vertical cross-sectional view of an exemplary intermediate structure including openings $O_{110a}$ in the package substrate upper surface layer 110a and openings $O_{110b}$ in package substrate lower surface layer 110b, according to one or more embodiments.

Openings $O_{110a}$ may be formed in the package substrate upper surface layer 110a so as to expose an upper surface of the package substrate upper bonding pads 114a. Openings $O_{110b}$ may be formed in the package substrate lower surface layer 110b so as to expose an upper surface of the package substrate lower bonding pads 116a. The openings $O_{110b}$ and the openings $O_{110b}$ may be formed, for example, by using a photolithographic process. In at least one embodiment, the openings $O_{110b}$ and the openings $O_{110b}$ may be formed in separate photolithographic processes.

The photolithographic process (e.g., processes) used to form the openings $O_{110a}$ may include forming a patterned photoresist mask (not shown) on the package substrate upper surface layer 110a, and etching (e.g., wet etching, dry etching, etc.) the exposed upper surface of the package substrate upper surface layer 110a through openings in the photoresist mask. The photoresist mask may be subsequently removed by ashing, dissolving the photoresist mask or by consuming the photoresist mask during the etch process.

The photolithographic process (e.g., processes) used to form the openings $O_{110b}$ may include forming a patterned photoresist mask (not shown) on the package substrate lower surface layer 110b, and etching (e.g., wet etching, dry etching, etc.) the exposed upper surface of the package substrate lower surface layer 110b through openings in the photoresist mask. The photoresist mask may be subsequently removed by ashing, dissolving the photoresist mask or by consuming the photoresist mask during the etch process.

After the openings $O_{110a}$ are formed in the package substrate upper surface layer 110a and the openings $O_{110b}$ are formed in the package substrate lower surface layer 110b, the package substrate upper surface layer 110a (upper solder resist layer) and the package substrate lower surface layer 110b may be cured such as by a thermal cure or ultraviolet (UV) cure.

Figure 2D:
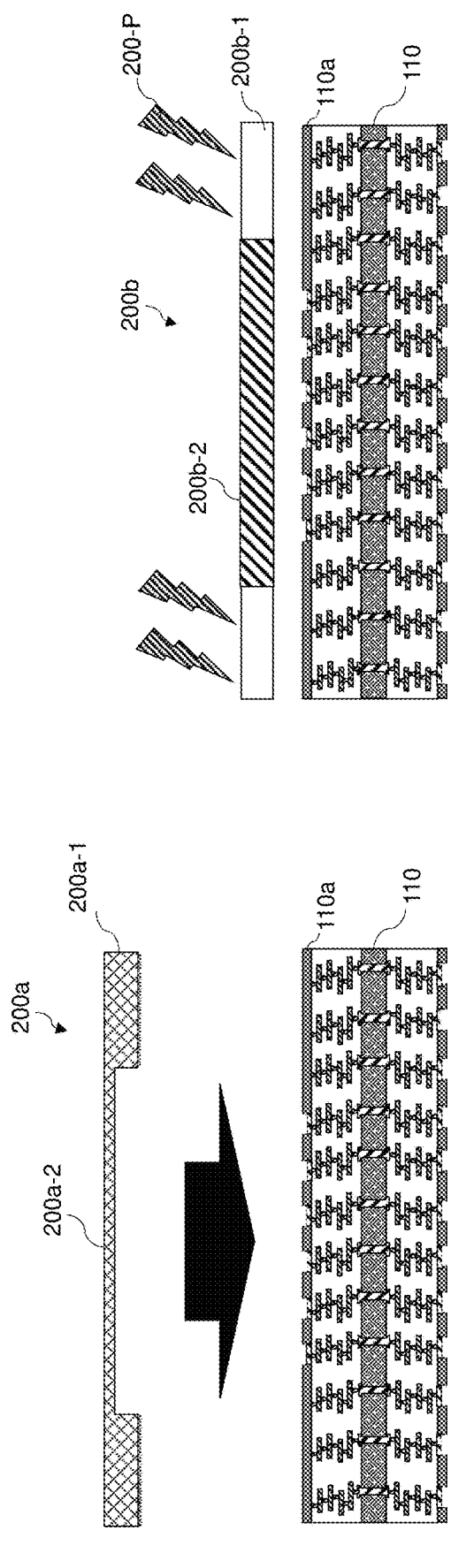
FIG. 2D is a vertical cross-sectional view of an exemplary intermediate structure including the package substrate upper surface layer undergoing a roughening treatment, according to one or more embodiments.

FIG. 2D is a vertical cross-sectional view of an exemplary intermediate structure including the package substrate upper surface layer 110a undergoing a roughening treatment, according to one or more embodiments. The package substrate upper surface layer 110a may undergo a roughening treatment in order to form the first surface area 110a-A1 of the package substrate upper surface layer 110a. It should be noted that after formation of the package substrate upper surface layer 110a, a surface of the package substrate upper surface layer 110a (e.g., the entire surface of the package substrate upper surface layer 110a) may have a surface roughness R2 (e.g., a smooth surface roughness). Therefore, during the roughening treatment, a portion of package substrate upper surface layer 110a corresponding to the second surface area 110a-A2 may be untreated or shielded from treatment.

There may be two alternative methods for performing the roughening treatment. The left side of FIG. 2D illustrates a first method of performing the roughening treatment which uses a mold 200a (e.g., customized mold). In the first method, the mold 200a may include a first portion 200a-1 with a roughened contact surface to be pressed onto a surface of the package substrate upper surface layer 110a. The mold 200a may also include a second portion 200a-2 which may not include a contact surface and is not intended to contact the surface of the package substrate upper surface layer 110a. Alternatively, the second portion 200a-2 may include a contact surface to be pressed onto the surface of the package substrate upper surface layer 110a, but the contact surface may have a lower roughness than the first portion 200a-1. Thus, the contact surface of the second portion 200a-2 may impart a roughness to the surface of the package substrate upper surface layer 110a that is less than the roughness imparted by the first portion 200a-1.

The mold 200a may be positioned over the package substrate 110 so that the first portion 200a-1 of the mold 200a is located over the region of the package substrate upper surface layer 110a corresponding to the first roughness area 110a-A1, and the second portion 200a-2 of the mold 200a is located over the region of the package substrate upper surface layer 110a corresponding to the second roughness area 110a-A2. The mold 200a is then pressed down onto the surface of the package substrate upper surface layer 110a so that the first portion 200a-1 roughens the surface of the package substrate upper surface layer 110a and forms the first roughness area 100a-A1.

The right side of FIG. 2D illustrates a second method of performing a roughening treatment which uses a plasma treatment shielding mask 200b. The plasma treatment shielding mask 200b may include a first portion 200b-1 corresponding to the first roughness area 110a-A1. The plasma treatment shielding mask 200b may also include a second portion 200b-2 corresponding to the second roughness area 110a-A2.

In the second method of performing the roughening treatment, a plasma 200-P (e.g., descum plasma) may be directed toward the package substrate upper surface layer 110a. The first portion 200b-1 of the plasma treatment shielding mask 200b may permit the plasma 200-P to reach the package substrate upper surface layer 110a and thereby form the first roughness area 110a-A1. The second portion 200b-2 of the plasma treatment shielding mask 200b may shield the package substrate upper surface layer 110a from the plasma 200-P and thereby form the second roughness area 110a-A2.

Figure 2E:
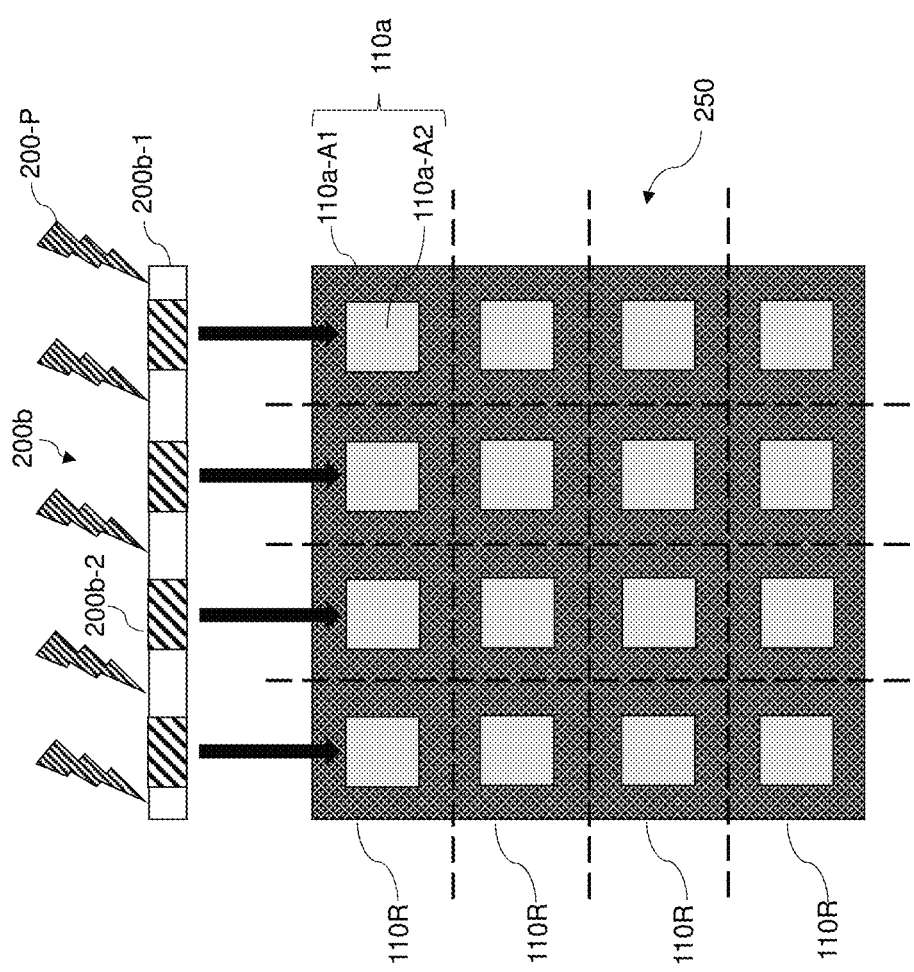
FIG. 2E is an exemplary intermediate structure including a panel (e.g., semiconductor wafer) having a plurality of package substrate regions, according to one or more embodiments.

FIG. 2E is an exemplary intermediate structure including a panel 250 (e.g., semiconductor wafer) having a plurality of package substrate regions 110-R, according to one or more embodiments. The roughening treatment described in FIG. 2D may alternatively be applied to the panel 250 in order to concurrently treat a plurality of package substrates 110. That is, the panel 250 may be treated and subsequently separated (along the dashed lines) to form sixteen (16) package substrates 110.

The panel 250 may undergo one of the two alternative roughening treatments described above with respect to FIG. 2D, in order to form (e.g., simultaneously form) the first roughness area 110a-A1 in each of the sixteen (16) package substrates 110. FIG. 2E illustrates the second method of performing the roughening treatment, but the first method (e.g., using the mold 200a) may also be used.

As illustrated in FIG. 2E, the plasma treatment shielding mask 200b may include a plurality of first portions 200b-1 corresponding to the first roughness area 110a-A1 in each of the package substrate regions 110R. The plasma treatment shielding mask 200b may also include a plurality of second portions 200b-2 corresponding to the second roughness area 110a-A2 in each of the package substrate regions 110R.

The plasma 200-P (e.g., descum plasma) may be directed toward the panel 250. The first portion 200b-1 of the plasma treatment shielding mask 200b may permit the plasma 200-P to reach the package substrate upper surface layer 110a and thereby form the first roughness area 110a-A1 in each of the plurality of package substrate regions 110R. The second portion 200b-2 of the plasma treatment shielding mask 200b may shield the package substrate upper surface layer 110a from the plasma 200-jP to maintain the original (as formed) roughness and thereby form the second roughness area 110a-A2 in each of the plurality of package substrate regions 110R.

Figure 2F:
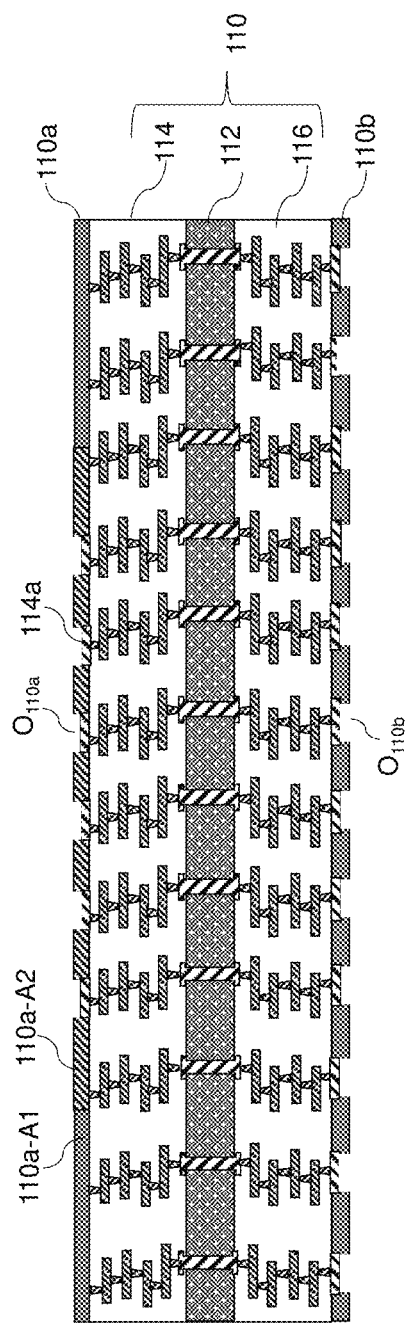
FIG. 2F is a vertical cross-sectional view of an exemplary intermediate structure including the package substrate upper surface layer after the roughening treatment, according to one or more embodiments.

FIG. 2F is an exemplary intermediate structure including the package substrate upper surface layer 110a after the roughening treatment, according to one or more embodiments. As illustrated in FIG. 2F, after the roughening treatment, the package substrate upper surface layer 110a may include the first surface area 110a-A1 and the second surface area 110a-A2. In at least one embodiment, the first surface area 110a-A1 may be substantially the same as the second surface area 110a-A2 (e.g., same thickness, same material, etc.) except that first surface area 110a-A1 may have a first surface roughness R1 and the second surface area 110a-A2 may have a second surface roughness R2 that is less than the first surface roughness R1.

Figure 2G:
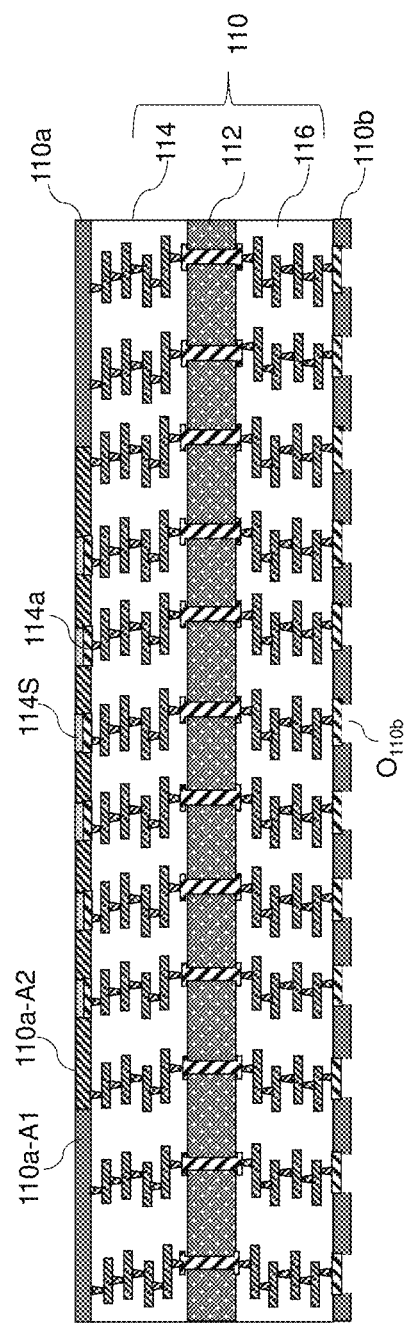
FIG. 2G is a vertical cross-sectional view of an exemplary intermediate structure after a surface treatment of the package substrate upper bonding pads, according to one or more embodiments.

FIG. 2G is an exemplary intermediate structure after a surface treatment of the package substrate upper bonding pads 114a, according to one or more embodiments. As illustrated in FIG. 2G, the surface treatment may be performed on a surface of the package substrate upper bonding pads 114a through the openings $O_{110a}$. The surface treatment may form a bonding pad surface layer 114S on the package substrate upper bonding pads 114a. The surface treatment may include, for example, an immersion tin treatment, an organic solderability preservative (OSP) treatment, and/or a solder-on-pad (SOP) treatment. The surface treatment may also include an electroless nickel/electroless palladium/immersion gold (ENEPIG) treatment. The bonding pad surface layer 114S may therefore, include one or more layers of metals (e.g., tin, nickel, palladium, gold, etc.) and/or other materials that may help to improve solder joint reliability with respect to the package substrate upper bonding pads 114a. A thickness of the bonding pad surface layer 114S may be such that an upper surface of the bonding pad surface layer 114S is substantially co-planar with an upper surface of the second surface area 110a-A2.

Figure 2H:
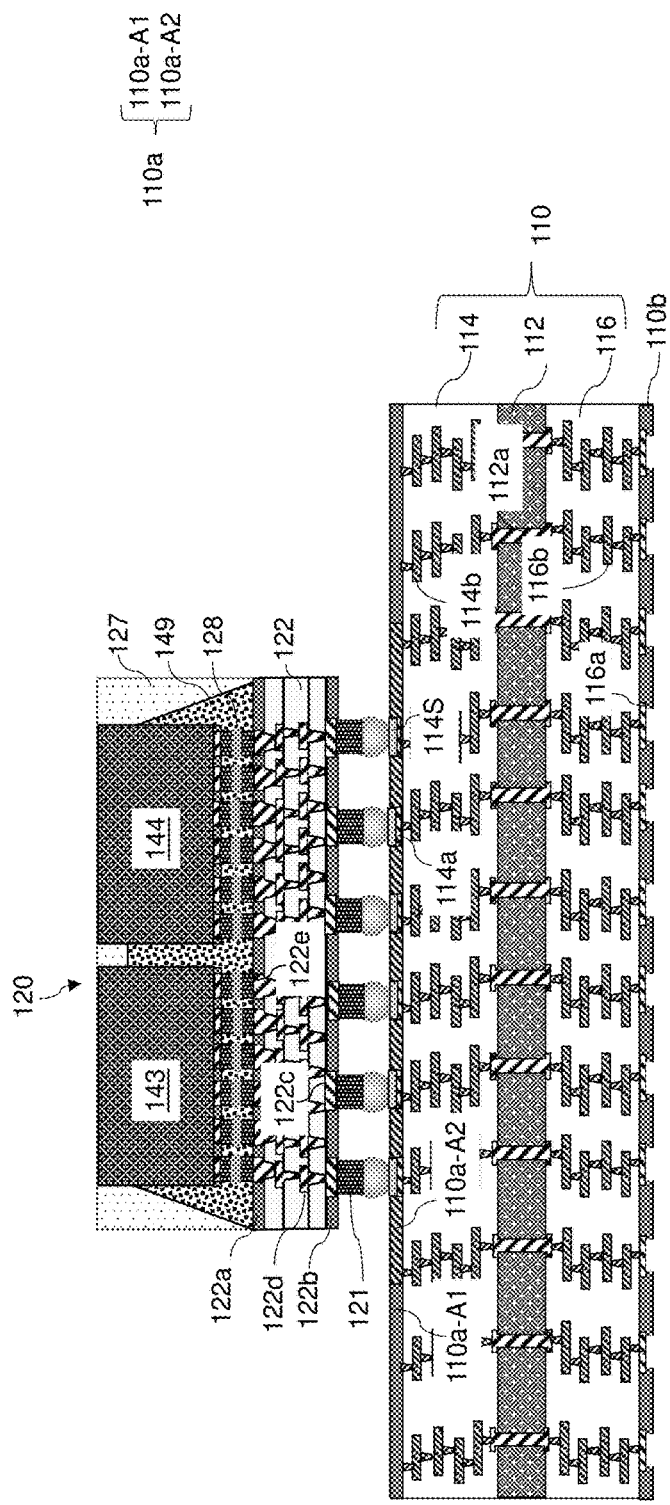
FIG. 2H is a vertical cross-sectional view of an intermediate structure in which the interposer module may be mounted on the package substrate (e.g., via a flip chip bonding (FCB) process) according to one or more embodiments.

FIG. 2H illustrates a vertical cross-sectional view of an intermediate structure in which the interposer module 120 may be mounted on the package substrate 110 (e.g., via a flip chip bonding (FCB) process) according to one or more embodiments. As illustrated in FIG. 2A, a solder portion of the C4 bumps 121 of the interposer module 120 may be positioned on bonding pad surface layer 114S formed on the package substrate upper bonding pads 114a. The intermediate structure may then be heated in order to bond the solder portion of the C4 bumps 121 to the bonding pad surface layer 114S and the package substrate upper bonding pads 114a.

Figure 2I:
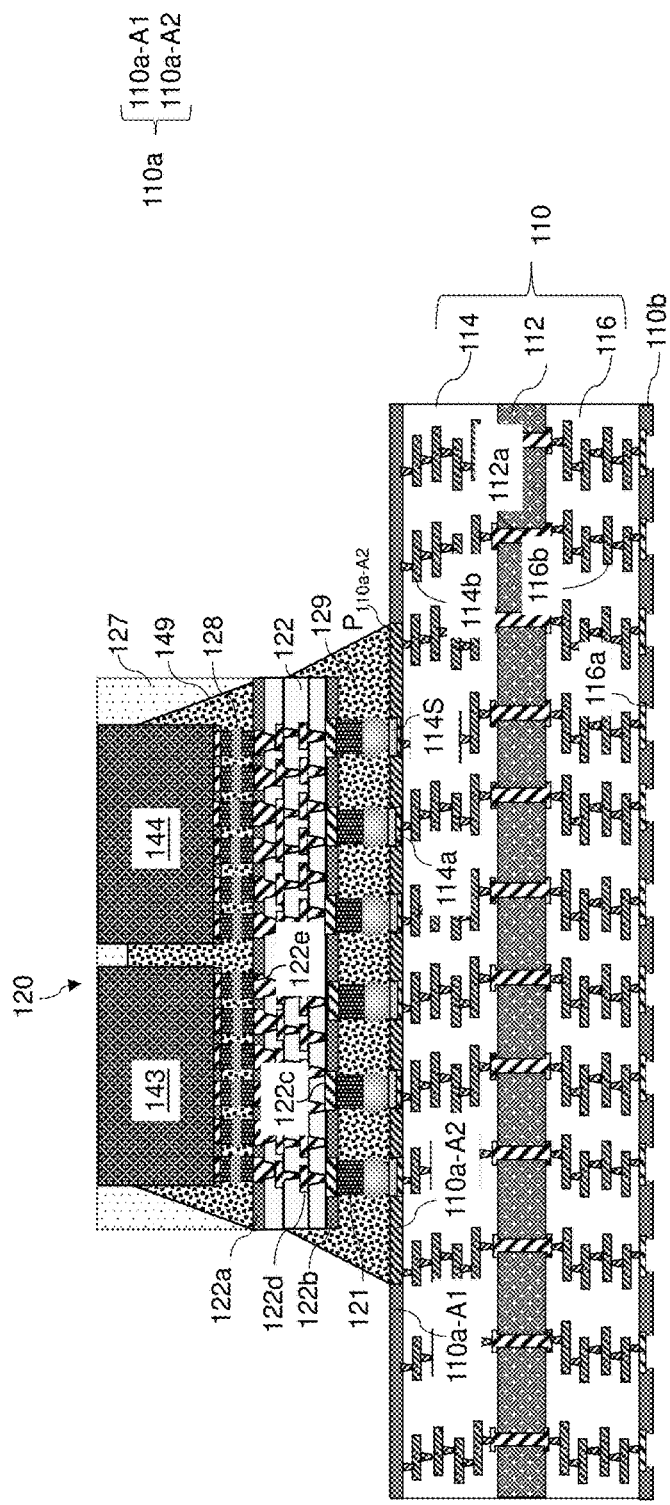
FIG. 2I is a vertical cross-sectional view of an intermediate structure in which the package underfill layer may be formed on the package substrate according to one or more embodiments.

FIG. 2I illustrates a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 2I, the package underfill layer 129 may be formed under and around the interposer module 120 and the C4 bumps 121 so as to fix the interposer module 120 to the package substrate 110.

The package underfill layer 129 may be formed, for example, by a capillary underfill process. In the capillary underfill process, an underfill material (e.g., epoxy) may be dispensed (e.g., using automatic syringe equipment) as a liquid onto the outer perimeter $P_{110a\text{-}A2}$ (e.g., periphery) of the second roughness area 110a-A2. In particular, the liquid underfill material may be dispensed at one or more sides of the interposer module 120. A capillary action may then draw the liquid underfill material toward a center region of the second roughness area 110a-A2 and into a space (e.g., microcavity) between the interposer module 120 and the package substrate 110. The liquid underfill material may be constrained from spreading past the outer perimeter $P_{110a\text{-}A2}$ of the second roughness area 110a-A2 by the interface with the first roughness area 110a-A1. Unlike typical semiconductor packages in which air voids may occur when the underfill material is not uniformly distributed, the relatively smooth surface of the second surface area 110a-A2 may thereby help to uniformly distribute the liquid underfill material and avoid air voids.

The package underfill material may then be cured so as to form the package underfill layer 129. The package underfill material may be cured, for example, in a box oven for about 90 minutes at about 150° C. to provide the package underfill layer 129 with a sufficient stiffness and mechanical strength.

Figure 2J:
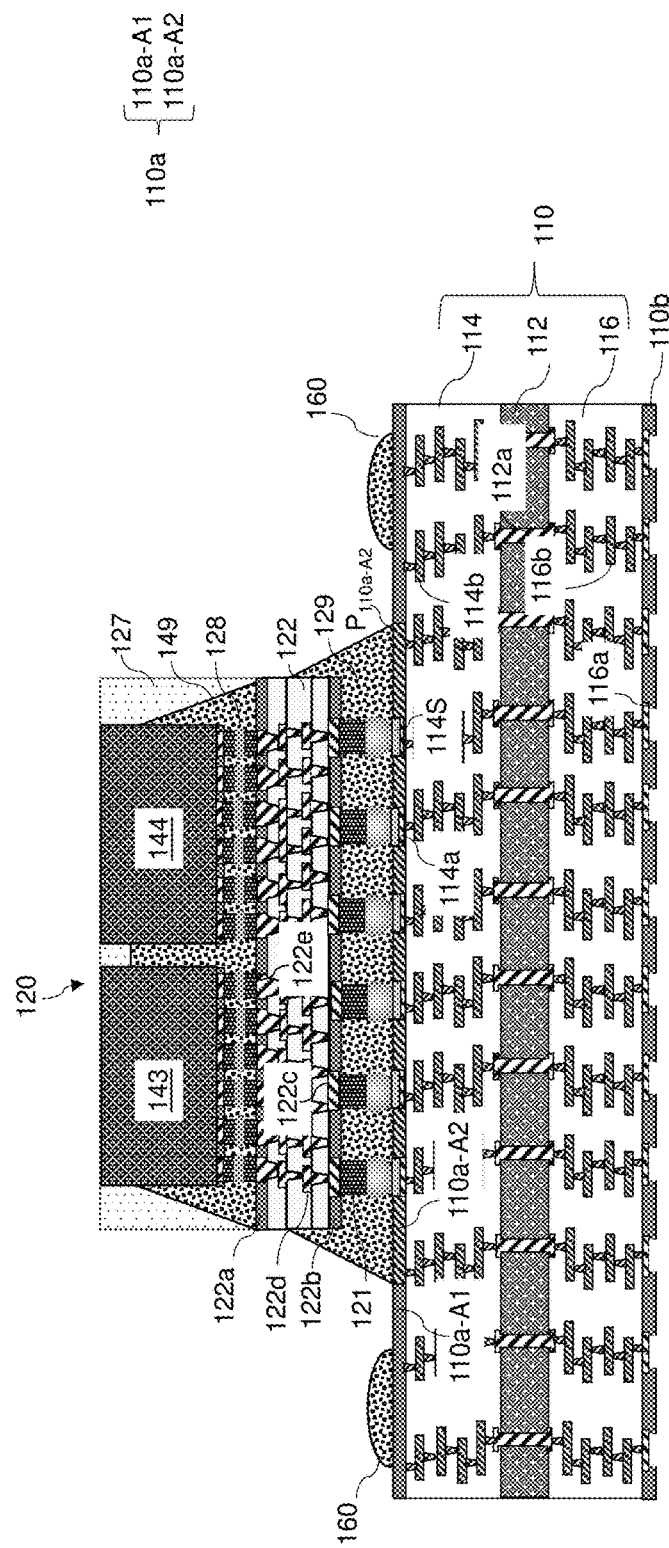
FIG. 2J is a vertical cross-sectional view of an intermediate structure in which the adhesive may be applied to the package substrate according to one or more embodiments.

FIG. 2J illustrates a vertical cross-sectional view of an intermediate structure in which the adhesive 160 may be applied to the package substrate 110 according to one or more embodiments. The adhesive 160 may include, for example, a silicone adhesive or an epoxy adhesive. The adhesive 160 may be located on the package substrate 110 at a position corresponding to a placement of the stiffener ring 150. In particular, the adhesive 160 may be formed as a continuous bead around an entire periphery of the interposer module 120. The adhesive 160 may be dispensed on a surface of the package substrate 110 in a quantity sufficient to securely bond the stiffener ring 150 to the package substrate 110.

Figure 2K:
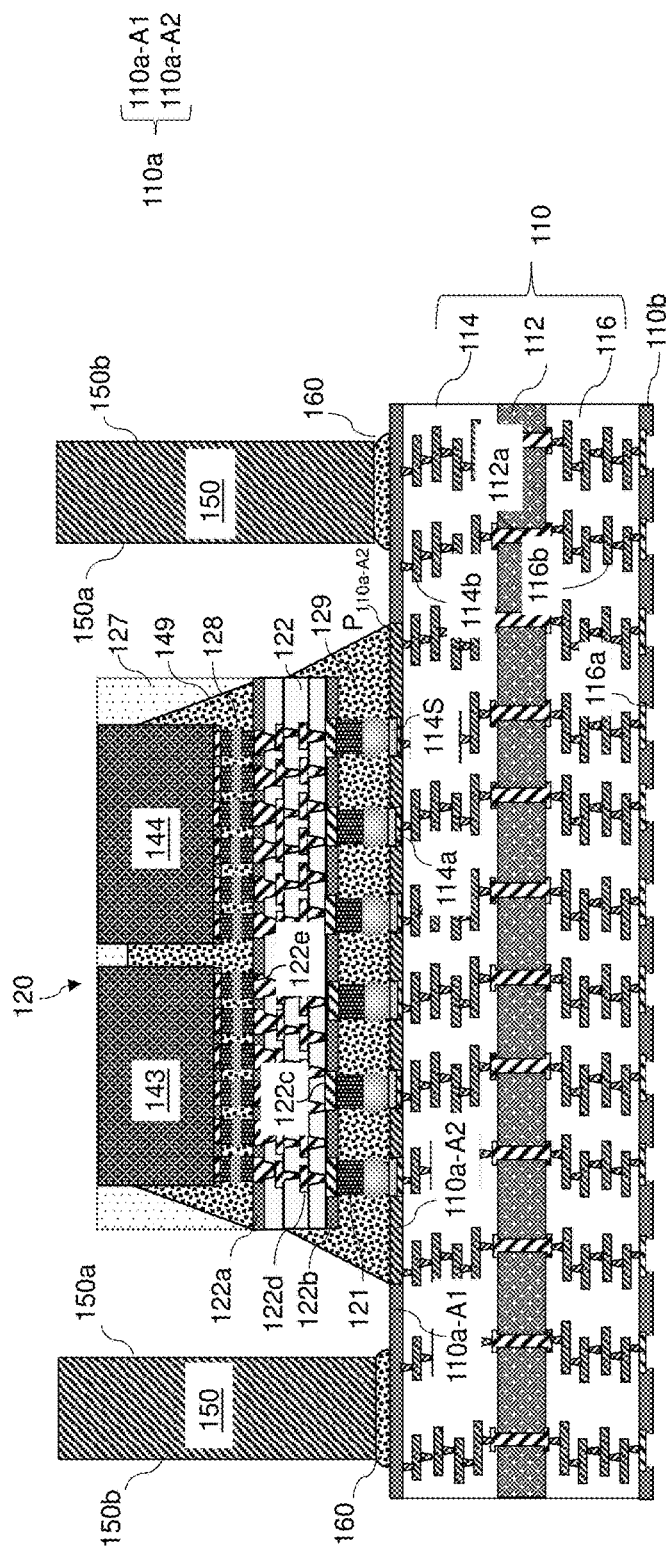
FIG. 2K is a vertical cross-sectional view of an intermediate structure in which the stiffener ring may be attached to (e.g., mounted on) the package substrate according to one or more embodiments.

FIG. 2K illustrates a vertical cross-sectional view of an intermediate structure in which the stiffener ring 150 may be attached to (e.g., mounted on) the package substrate 110 according to one or more embodiments. The stiffener ring 150 may be composed of metal material (e.g., aluminum) and may be formed, for example, by milling using a computer numerical control (CNC) milling machine.

The package substrate 110 with the interposer module 120 may be placed on a surface and the stiffener ring 150 lowered down onto the package substrate 110 around the interposer module 120. The stiffener ring 150 may then be aligned with the adhesive 160 formed on the package substrate 110. The stiffener ring 150 may then be pressed downward by applying a pressing force down onto the stiffener ring 150 so that the stiffener ring 150 may be fixed to the package substrate 110 through the adhesive 160.

Alternatively, the stiffener ring 150 may be placed on a surface (e.g., a flat surface), and the package substrate 110 inverted and lowered onto the stiffener ring 150. That is, the interposer module 120 is inserted into the stiffener ring 150. The package substrate 110 and interposer module 120 may then be pressed by applying a pressing force down into stiffener ring 150 so that the stiffener ring 150 is fixed to the package substrate 110 through the adhesive 160.

The stiffener ring 150 may be clamped to the package substrate 110 for a period to allow the adhesive 160 to cure and form a secure bond between the package substrate 110 and the stiffener ring 150. The clamping of the stiffener ring 150 to the package substrate 110 may be performed, for example, by using a heat clamp module. The heat clamp module may apply a uniform force across the upper surface of the stiffener ring 150.

Figure 2L:
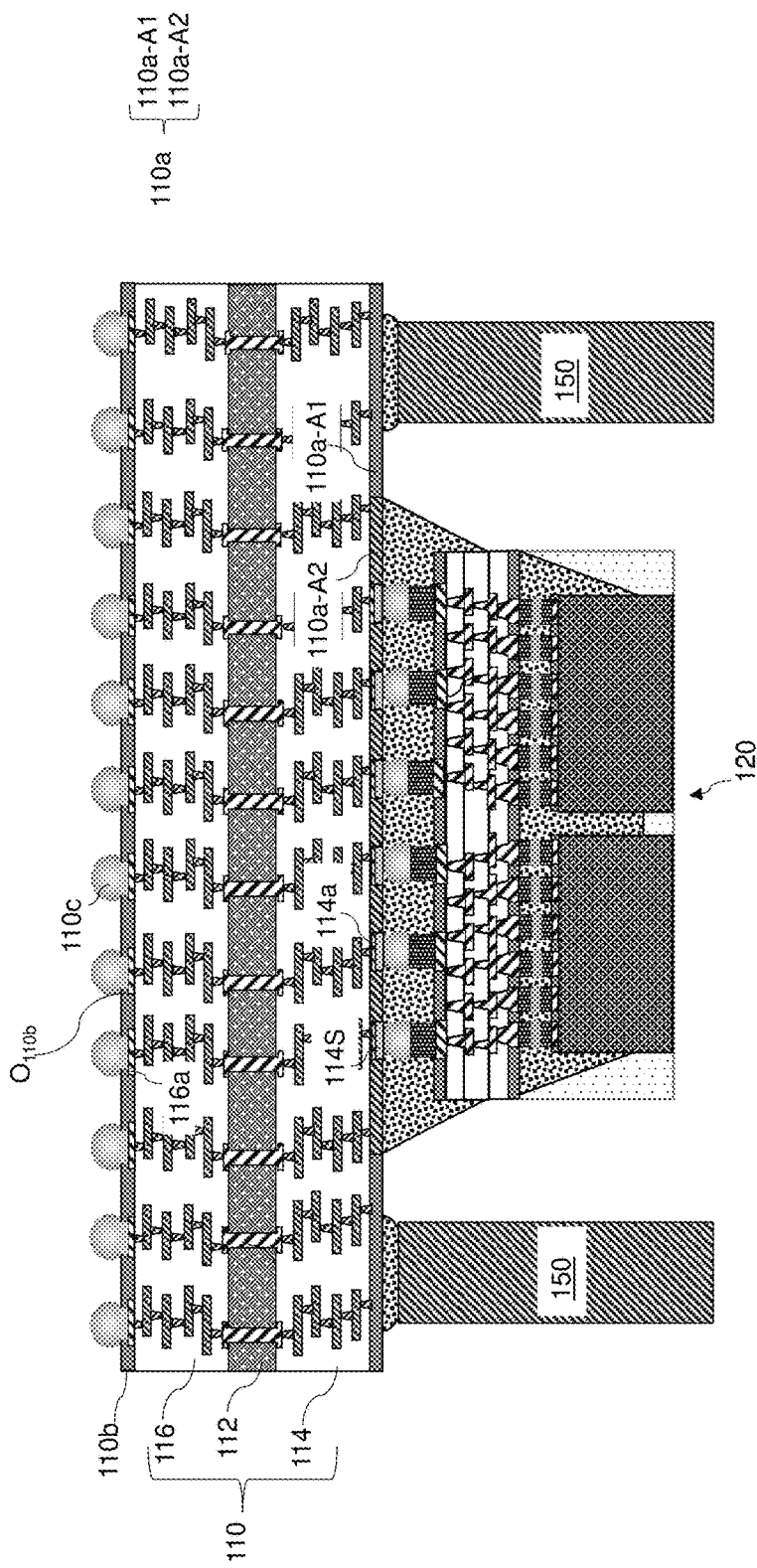
FIG. 2L is a vertical cross-sectional view of an intermediate structure in which a plurality of solder balls may be formed on the package substrate according to one or more embodiments.

FIG. 2L illustrates a vertical cross-sectional view of an intermediate structure in which a plurality of solder balls 110c may be formed on the package substrate 110 according to one or more embodiments. The plurality of solder balls 110c may be formed on the lower bonding pads 116a through the openings $O_{110b}$ in the package substrate lower surface layer 110b. The solder balls 110c may be formed, for example, by an electroplating process. The plurality of solder balls 110c may contact the lower bonding pads 116a through openings in the lower passivation layer 110b. The solder balls 110c may be formed, for example, so as to be located under the stiffener ring 150 and under the interposer module 120. The plurality of solder balls 110c may constitute a ball-grid array (BGA) that may allow the semiconductor package 100 to be securely mounted (e.g., by surface mount technology (SMT)) on a substrate such as a printed circuit board and electrically coupled to the substrate. In some embodiments, the solder balls 110c may be formed before providing the adhesive 160 or mounting the interposer module 120.

Figure 3:
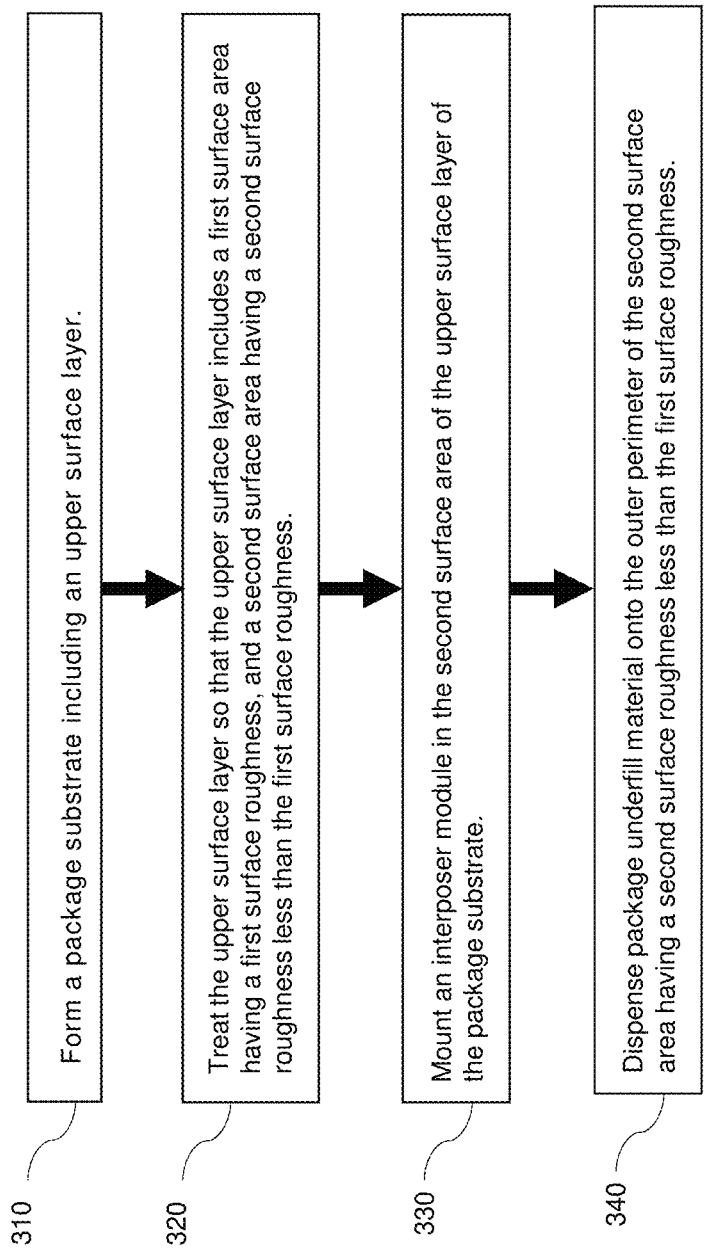
FIG. 3 is a flow chart illustrating a method of making a semiconductor package according to one or more embodiments.

FIG. 3 is a flow chart illustrating a method of making a semiconductor package 100 according to one or more embodiments. Step 310 may include forming a package substrate 110 including an upper surface layer 110a. Step 320 may include treating the upper surface layer 110a so that the upper surface layer 110a includes a first surface area 110a-A1 having a first surface roughness R1, and a second surface area 110a-A2 having a second surface roughness R2 less than the first surface roughness R1. Step 330 may include mounting an interposer module 120 in the second surface area 110a-A2 of the upper surface layer 110a of the package substrate 110. Step 340 may include injecting a package underfill material 129 onto the outer perimeter of the second surface area 110a-A2 having a second surface roughness R2 less than the first surface roughness R1.

Figure 4:
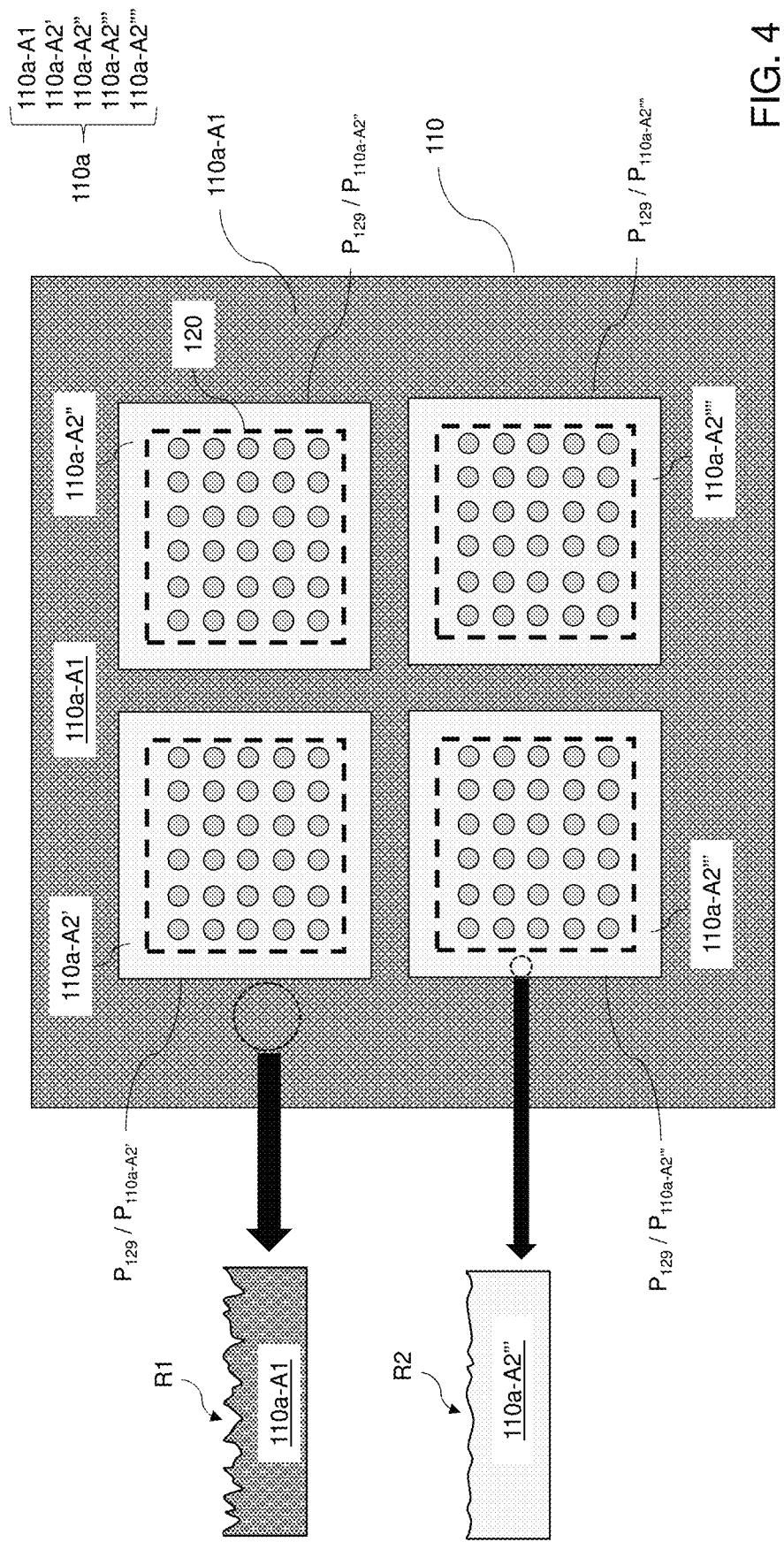
FIG. 4 is a horizontal cross-sectional view of a first alternative design of the semiconductor package according to one or more embodiments along line AA' in FIG. 1A.

FIG. 4 is a horizontal cross-sectional view of a first alternative design of the semiconductor package 100 according to one or more embodiments (along a similar line AA' as shown in FIG. 1A). Some elements of the semiconductor package 100 including the interposer module 120, stiffener ring 150 and package underfill layer 129 are not shown or are shown only by dotted lines in FIG. 4 for ease of explanation.

As illustrated in FIG. 4, in the first alternative design, the package substrate upper surface layer 110a may include a plurality of second surface areas having a second surface roughness R2. The second surface areas may include second surface area 110a-A2', second surface area 110a-A2", second surface area 110a-A2''' and second surface area 110a-A2''''. Each of the second surface areas 110a-A2', 110a-A2", 110a-A2''' and 110a-A2'''', may include a bump joint area in which an interposer module 120 (shown by dashed lines) is mounted to the package substrate 110.

The package substrate upper surface layer 110a may also include a first surface area 110a-A1 having a first surface roughness R1 greater than the second surface roughness R2. The first surface area 110a-A1 may be formed around and between the second surface areas 110a-A2', 110a-A2", 110a-A2''' and 110a-A2''''. The first surface area 110a-A1 may be formed around an entire outer perimeter of each of second surface areas 110a-A2', 110a-A2", 110a-A2''' and 110a-A2''''.

In addition, the outer perimeter P129 of the package underfill layer 129 may be substantially coextensive with the outer perimeter $P_{110a\text{-}A2'}$ of the second surface area 110a-A2'. The outer perimeter P129 of the package underfill layer 129 may be substantially coextensive with the outer perimeter $P_{110a\text{-}A2''}$ of the second surface area 110a-A2". The outer perimeter P129 of the package underfill layer 129 may be substantially coextensive with the outer perimeter $P_{110a\text{-}A2'''}$ of the second surface area 110a-A2'''. The outer perimeter P129 of the package underfill layer 129 may be substantially coextensive with the outer perimeter $P_{110a\text{-}A2''''}$ of the second surface area 110a-A2''''.

Figure 5:
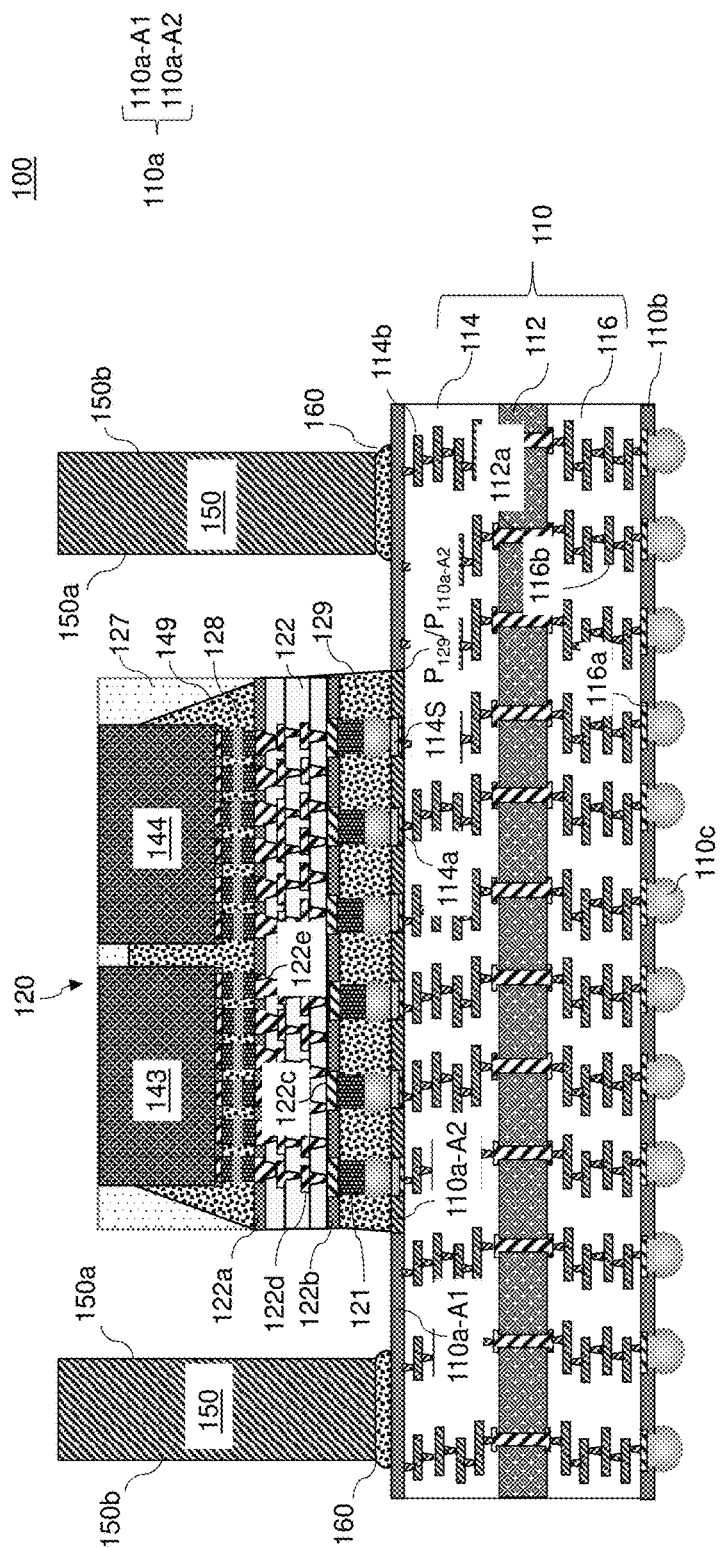
FIG. 5 is a vertical cross-sectional view of a second alternative design of the semiconductor package according to one or more embodiments.

FIG. 5 is a vertical cross-sectional view of a second alternative design of the semiconductor package 100 according to one or more embodiments. Unlike the semiconductor package 100 in FIG. 1A in which the width of the second surface area 110a-A2 (e.g., in the x-direction and/or y-direction) may be greater than the width of the interposer module 120, in the second alternative design the width of the second surface area 110a-A2 (e.g., in the x-direction and/or y-direction) may be substantially the same as the width of the interposer module 120. Therefore, in the second alternative design, both the outer perimeter P129 of the package underfill layer 129 and the outer perimeter $P_{110a\text{-}A2}$ of the second surface area 110a-A2 may be substantially aligned in the z-direction with an outer edge (e.g., sidewall) of the interposer module 120.

Figure 6:
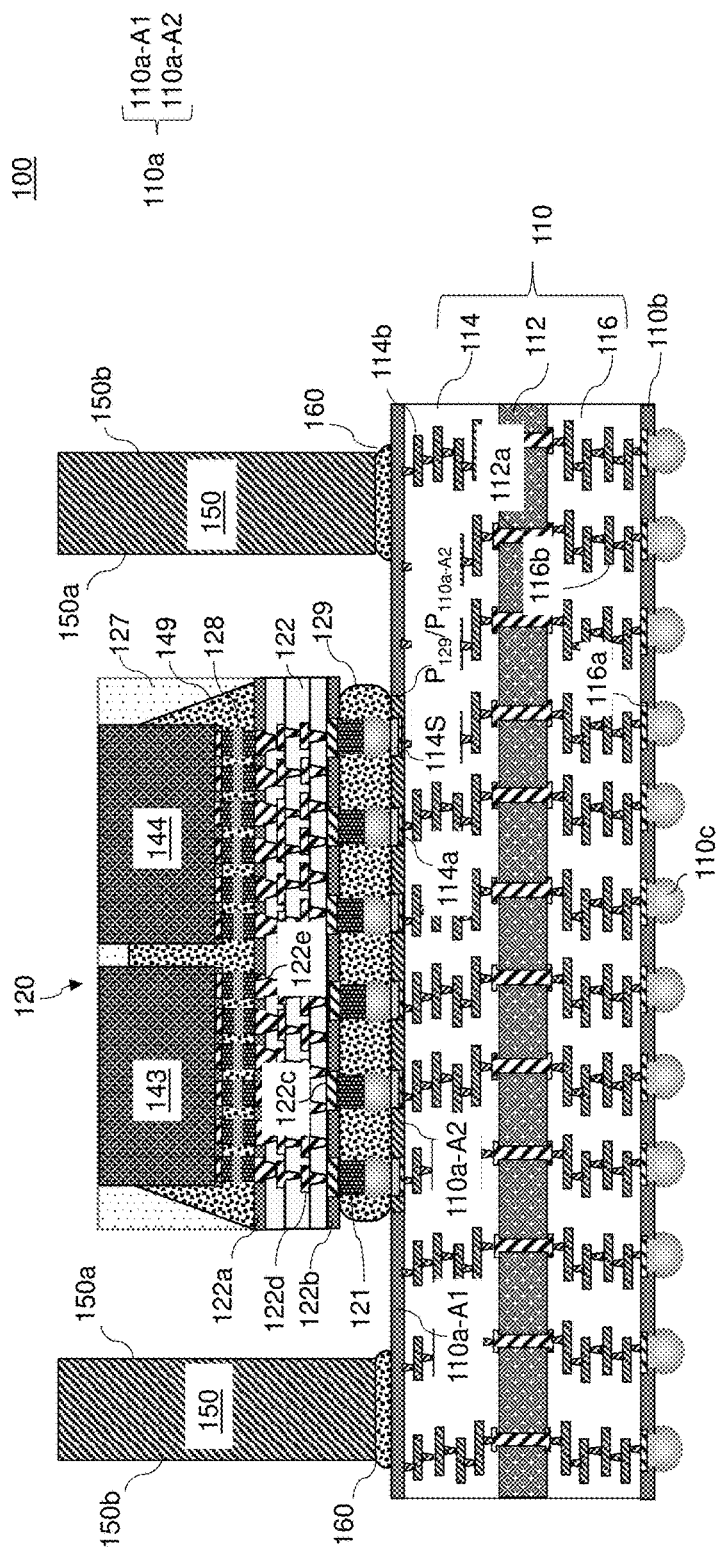
FIG. 6 is a vertical cross-sectional view of a third alternative design of the semiconductor package according to one or more embodiments.

FIG. 6 is a vertical cross-sectional view of a third alternative design of the semiconductor package 100 according to one or more embodiments. Unlike the second alternative design in FIG. 5, in the third alternative design the width of the second surface area 110a-A2 (e.g., in the x-direction and/or y-direction) may be less than the width of the interposer module 120. Therefore, in the third alternative design, the outer perimeter P129 of the package underfill layer 129 and/or the outer perimeter $P_{110a-A2}$ of the second surface area 110a-A2 may be located beneath the interposer module 120. That is, an outer sidewall (e.g., edge) of the interposer module 120 may be outside (e.g., in the x-direction and/or y-direction) the outer perimeter P129 (e.g., outermost edge) of the package underfill layer 129 and/or the outer perimeter $P_{110a-A2}$ (e.g., outermost edge) of the second surface area 110a-A2.

Figure 7A:
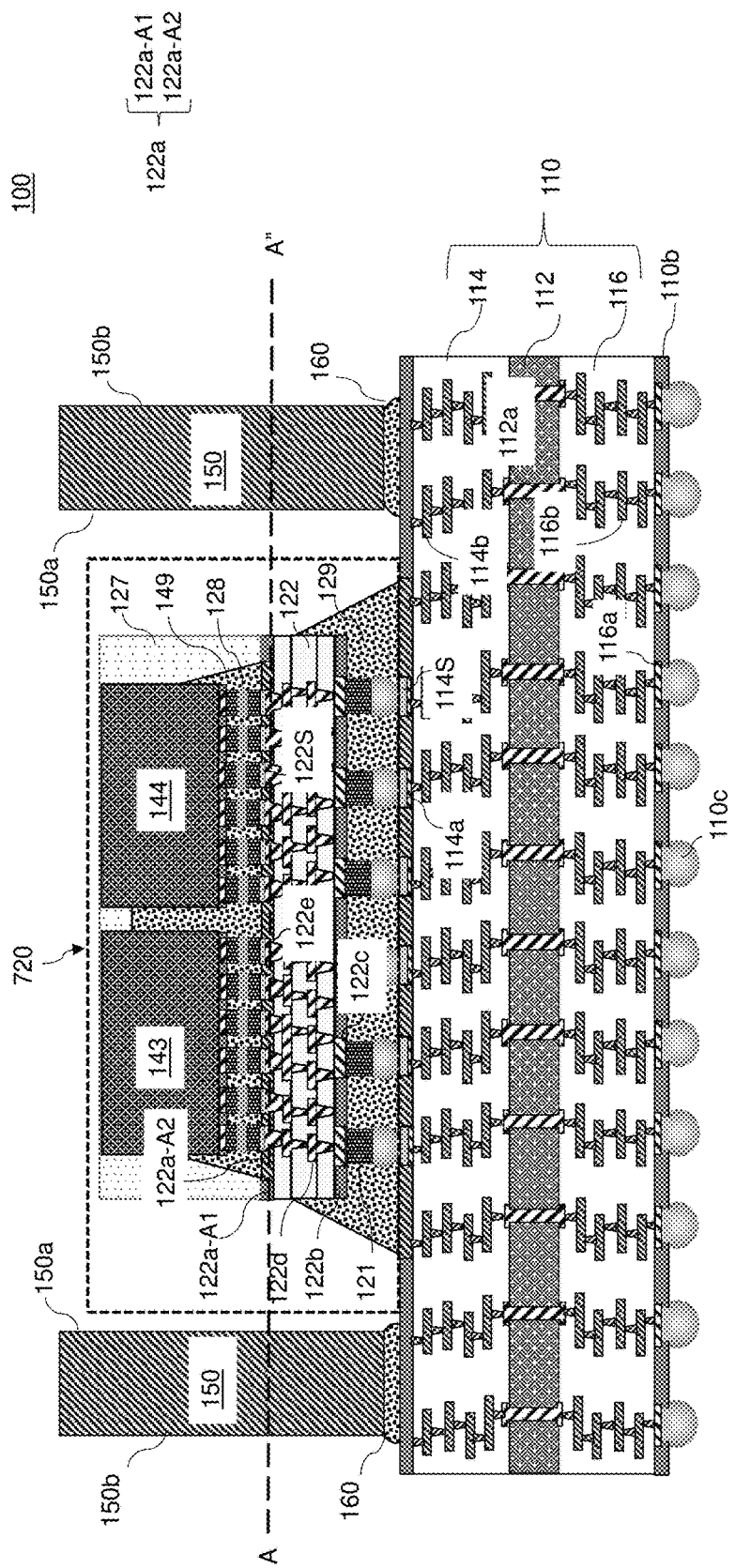
FIG. 7A is a vertical cross-sectional view of an interposer module that may be included in the semiconductor package according to one or more embodiments.
Figure 7B:
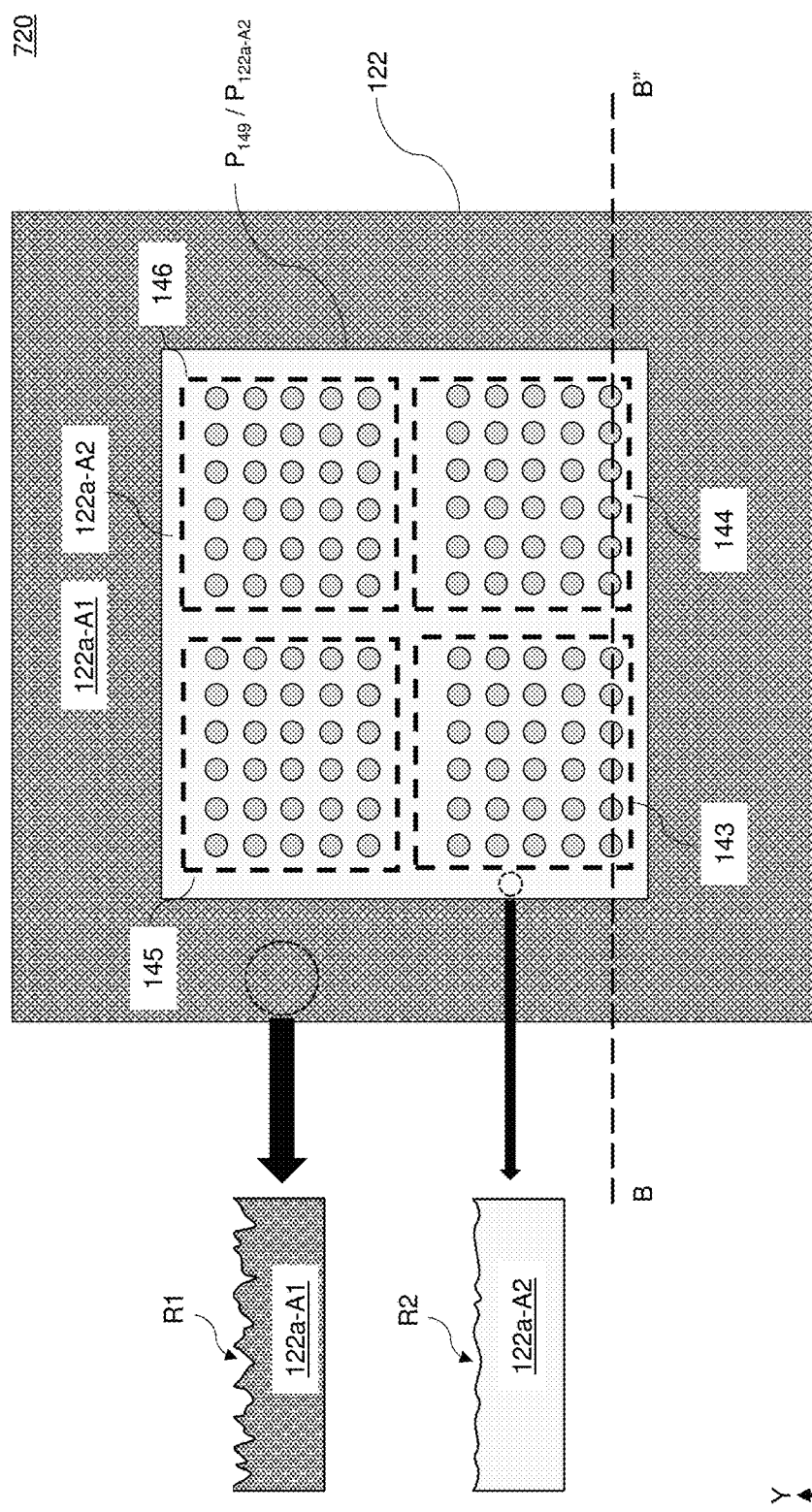
FIG. 7B is a horizontal cross-sectional view of the interposer module according to one or more embodiments along line AA' in FIG. 7A.

FIG. 7A is a vertical cross-sectional view of a semiconductor package 100 that may include an interposer module 720 according to one or more embodiments. In particular, FIG. 7A is cross-sectional view of semiconductor package 100 including interposer module 720 along the cross-section line B-B' in FIG. 7B. FIG. 7B is a horizontal cross-sectional view of a semiconductor package 100 including interposer module 720 along cross-section line A-A' in FIG. 7A. It should be noted that the semiconductor package 100 is shown in FIG. 7A only for context. It is not necessary that the interposer module 720 is part of a semiconductor package and may be separate from a semiconductor package.

The interposer module 720 in FIGS. 7A-7B may be similar to the interposer module 120 in FIGS. 1A-1B, except that in in FIGS. 7A-7B, the interposer upper surface layer 122a (e.g., solder resist layer) may include a first surface area 122a-A1 and a second surface area 122a-A2. The structure and function of the first surface area 122a-A1 and the second surface area 122a-A2 may be substantially the same as the structure and function of the first surface area 110a-A1 and the second surface area 110a-A2 in FIGS. 1A-1B, respectively. In particular, the first surface area 122a-A1 may having first surface roughness R1. The second surface area 122a-A2 may have a second surface roughness R2 that is less than the first surface roughness R1. In at least one embodiment, the first surface roughness R1 may be at least 1.5 times the second surface roughness R2.

The first surface area 122a-A1 and the second surface area 122a-A2 may also be formed in substantially the same manner as the first surface area 110a-A1 and the second surface area 110a-A2, respectively. That is, the method of forming the first surface area 110a-A1 and the second surface area 110a-A2 described above (e.g., see FIGS. 2D-2E) may also be used to form the first surface area 122a-A1 and the second surface area 122a-A2, respectively. In addition, a width of the second surface area 122a-A2 in the fourth alternative design may be varied (e.g., in the x-direction and/or y-direction) so as to constrain a width of the interposer underfill layer 149 in a manner similar to the manner in which the width of the second surface area 110a-A2 may be varied so as to constrain a width of the packager underfill layer 129 in the second and third alternative designs of the semiconductor package 100 (e.g., see FIGS. 5-6).

The interposer upper surface layer 122a may include a hybrid surface roughness (e.g., a plurality of different values of surface roughness) in a dedicated region (e.g., a region in and around an area of mounting the first semiconductor device 143 and second semiconductor device 144). The hybrid surface roughness of the interposer upper surface layer 122a may enhance the qualities of the interposer underfill layer 149. The hybrid surface roughness may provide better underfill flow and filling performance by constructing areas having different surface roughness values. In particular, the second surface area 122a-A2 may include a bump joint area (e.g., an area where the microbumps 128 are connected to the interposer upper bonding pads 122e). The first surface area 122a-A1 may include no component joint area (e.g., an area where no microbumps 128 are located). It should be noted that although only one second surface area 122a-A2 is illustrated in FIG. 7A, the semiconductor package 100 may include any number of second surface areas 122a-A2.

The hybrid surface roughness of the interposer upper surface layer 122a may provide the semiconductor package 100 with several advantages and benefits. For example, the second surface roughness R2 (e.g., smooth surface roughness) may provide the better condition for flowing the interposer underfill layer 149 which can result in less flow striation and lower a risk of a void in the interposer underfill layer 149. Further, the second surface area 122a-A2 (e.g., bump joint area) can constrain a bleeding of the interposer underfill layer 149 (e.g., provide a constrained boundary for underfill flow out area (e.g., bleeding)). That is, an underfill bleeding area may not extend beyond the outer perimeter of the second surface area 122a-A2.

A size of the second surface area 122a-A2 can be controlled, for example, to be in a range from about 10% of a total surface area of the interposer upper surface layer 122a to about 90% of a total surface area of the interposer upper surface layer 122a. A number of the second surface areas 122a-A2 is not limited as long as the number can be afforded within the total surface area.

FIG. 7B is a horizontal cross-sectional view of the interposer module 720 according to one or more embodiments along line A-A' in FIG. 7A. Some elements of the interposer module 720 including the molding material layer 127, interposer underfill layer 149 may not be shown for ease of explanation.

As illustrated in FIG. 7B, the interposer module 720 may include a third semiconductor device 145 and a fourth semiconductor device 146 that are not illustrated in FIG. 7A. The third semiconductor device 145 and fourth semiconductor device 146 may be similar to the first semiconductor device 143 and second semiconductor device 144.

In addition, the first surface area 122a-A1 of the interposer upper surface layer 122a may be formed around an entire outer perimeter $P_{122a-A2}$ of the second surface area 122a-A2 of the interposer upper surface layer 122a. The second surface area 122a-A2 may have a width in the x-direction that is greater than a combined width of the first semiconductor device 143 and second semiconductor device 144 in in the x-direction, and greater than a combined width of the third semiconductor device 145 and fourth semiconductor device 146 in in the x-direction. The second surface area 122a-A2 may also have a width in the y-direction that is greater than a combined width of the first semiconductor device 143 and third semiconductor device 145 in the y-direction, and greater than a combined width of the second semiconductor device 144 and fourth semiconductor device 146 in the y-direction. In addition, the outer perimeter P149 of the interposer underfill layer 149 may be substantially coextensive with the outer perimeter $P_{122a-A2}$ of the second surface area 122a-A2.

Figure 8A:
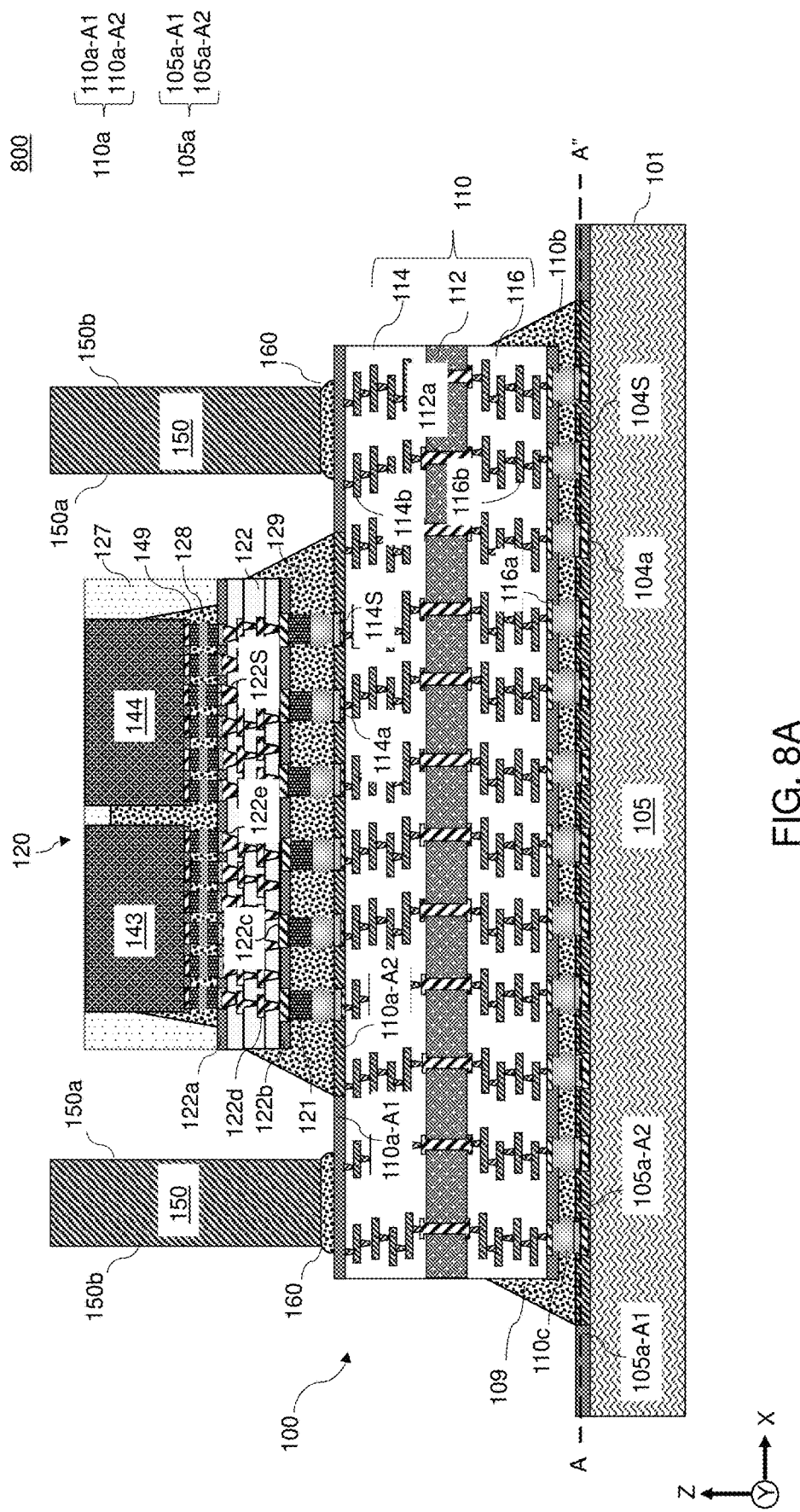
FIG. 8A is a vertical cross-sectional view of a semiconductor device according to one or more embodiments.
Figure 8B:
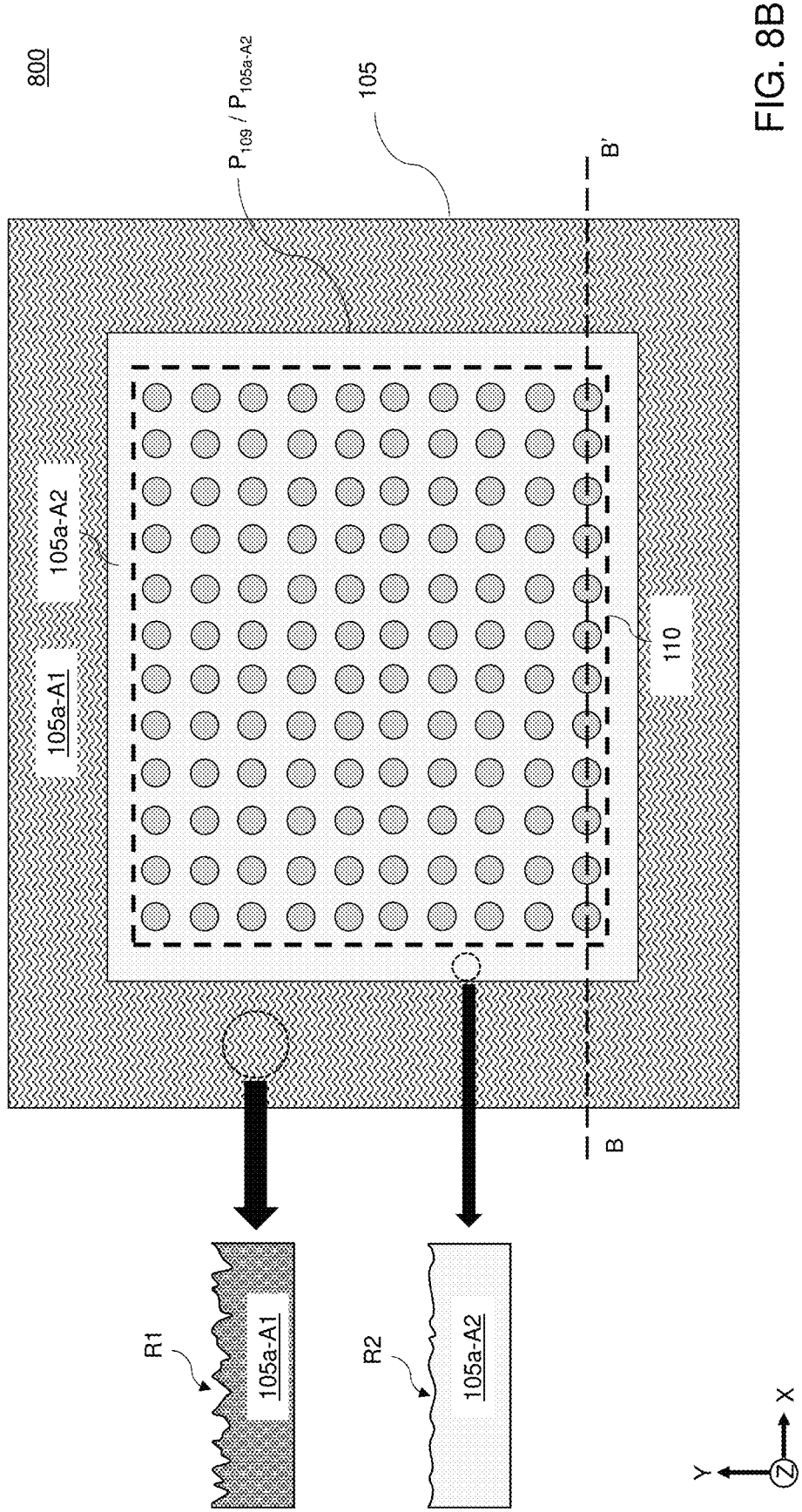
FIG. 8B is a horizontal cross-sectional view of a PCB according to one or more embodiments along line AA' in FIG. 8A.

FIG. 8A is a vertical cross-sectional view of a semiconductor device 800 according to one or more embodiments. In particular, FIG. 8A is vertical cross-sectional view of the semiconductor device 800 along the cross-section B-B" in FIG. 8B. FIG. 8B is a horizontal cross-sectional view of the semiconductor device 800 and in particular the top surface of printed circuit board (PCB) 105 according to one or more embodiments along line A-A' in FIG. 8A.

The semiconductor device 800 may include a printed circuit board (PCB) 105 and the semiconductor package 100 mounted on the PCB 105. In particular, the PCB 105 may include a PCB dielectric layer 101 (e.g., fiberglass, epoxy, etc.) and a plurality of PCB bonding pads 104a on the PCB dielectric layer 101. The PCB bonding pads 104a may be similar to the package substrate upper bonding pads 114a. A bonding pad surface layer 104S (e.g., one or more layers of metals (e.g., tin, nickel, palladium, gold, etc.) and/or other materials) may be formed on the PCB bonding pads 104a to improve solder joint reliability.

The PCB dielectric layer 101 may also include a PCB upper surface layer 105a (e.g., solder resist layer) formed around the PCB bonding pads 104a. The PCB upper surface layer 105a may be similar to the package substrate upper surface layer 110a. In particular, the PCB upper surface layer 105a may include a first surface area 105a-A1 having a first surface roughness R1 and a second surface area 105a-A2 having a second surface roughness R2 that is less than the first surface roughness R1. In at least one embodiment, the first surface roughness R1 may be at least 1.5 times the second surface roughness R2.

The semiconductor package 100 may be mounted on the PCB 105 so that the solder balls 110c of the BGA may be connected to the PCB bonding pads 104a and the bonding pad surface layer 104S. A PCB underfill layer 109 (e.g., similar to the package underfill layer 129) may be formed between the semiconductor package 100 and the PCB 105.

The structure and function of the first surface area 105a-A1 and the second surface area 105a-A2 may be substantially the same as the structure and function of the first surface area 110a-A1 and the second surface area 110a-A2 in FIGS. 1A-1B, respectively. The first surface area 105a-A1 and the second surface area 105a-A2 may also be formed in substantially the same manner as the first surface area 110a-A1 and the second surface area 110a-A2, respectively. That is, the method of forming the first surface area 110a-A1 and the second surface area 110a-A2 described above (e.g., see FIGS. 2D-2E) may also be used to form the first surface area 105a-A1 and the second surface area 105a-A2, respectively. In addition, a width of the second surface area 105a-A2 may be varied (e.g., in the x-direction and/or y-direction) so as to constrain a width of the PCB underfill layer 109 in a manner similar to the manner in which the width of the second surface area 110a-A2 may be varied so as to constrain a width of the packager underfill layer 129 in the second and third alternative designs of the semiconductor package 100 (e.g., see FIGS. 5-6).

The PCB upper surface layer 105a may include a hybrid surface roughness (e.g., a plurality of different values of surface roughness) in a dedicated region (e.g., a region in and around an area of mounting the semiconductor package 100). The hybrid surface roughness of the PCB upper surface layer 105a may enhance the qualities of the PCB underfill layer 109. The hybrid surface roughness may provide better underfill flow and filling performance by constructing areas having different surface roughness values. In particular, the second surface area 105a-A2 may include a bump joint area (e.g., an area where the solder balls 110c of the BGA are connected to the PCB bonding pads 104a). The first surface area 105a-A1 may include no component joint area (e.g., an area where the semiconductor package 100 is not located). It should be noted that although only one second surface area 105a-A2 is illustrated in FIG. 8A, the semiconductor device 800 may include any number of second surface areas 105a-A2.

The hybrid surface roughness of the PCB upper surface layer 105a may provide the semiconductor device 800 with several advantages and benefits. For example, the second surface roughness R2 (e.g., smooth surface roughness) may provide the better condition for flowing the PCB underfill layer 109 which can result in less flow striation and lower a risk of a void in the PCB underfill layer 109. Further, the second surface area 105a-A2 (e.g., bump joint area) can constrain a bleeding of the PCB underfill layer 109. That is, an underfill bleeding area may not extend beyond the outer perimeter of the second surface area 105a-A2.

A size of the second surface area 105a-A2 can be controlled, for example, to be in a range from about 10% of a total surface area of the PCB upper surface layer 105a to about 90% of a total surface area of the PCB upper surface layer 105a. A number of the second surface areas 105a-A2 is not limited as long as the number can be afforded within the total surface area.

FIG. 8B is a horizontal cross-sectional view of the semiconductor device 800 and in particular the top surface of printed circuit board (PCB) 105 according to one or more embodiments along line A-A' in FIG. 8A. Some elements of the semiconductor device 800 including the interposer module 120, stiffener ring 150 and PCB underfill layer 109 are not shown or are shown only by dotted lines in FIG. 8B for ease of explanation.

As illustrated in FIG. 8B, the first surface area 105a-A1 of the PCB upper surface layer 105a may be formed around an entire outer perimeter P105a-A2 of the second surface area 105a-A2 of the PCB upper surface layer 105a. The second surface area 105a-A2 may have a width in the x-direction and/or y-direction that is greater than a width of the package substrate 110. In addition, the outer perimeter P109 of the PCB underfill layer 109 may be substantially coextensive with the outer perimeter P105a-A2 of the second surface area 105a-A2.

Referring to FIGS. 1A-8B, a semiconductor package 100 includes a package substrate 110 including an upper surface layer 110a including a first surface area 110a-A1 having a first surface roughness R1, and a second surface area 110a-A2 having a second surface roughness R2 less than the first surface roughness R1, and an interposer module 120 mounted on the upper surface layer 110a of the package substrate 110 in the second surface area 110a-A2.

In one embodiment, the second surface area 110a-A2 may include a bump joint area including a plurality of solder joints 121 for electrically connecting the interposer module 120 to the package substrate 110. In one embodiment, the second surface area 110a-A2 may be surrounded by the first surface area 110a-A1. In one embodiment, the first surface roughness R1 may be greater than 1.5 times the second surface roughness R2. In one embodiment, the upper surface layer 110a may include a solder resist (SR) layer, a polybenzobisoxazole (PBO) layer, or a polyimide (PI) layer. In one embodiment, the second surface area 110a-A2 may include a plurality of second surface area 110a-A2s that are each surrounded by the first surface area 110a-A1. In one embodiment, a ratio of the second surface area 110a-A2 to a total surface area of the upper surface layer 110a may be in a range from 0.10 to 0.90. In one embodiment, the semiconductor package 100 may further include a package underfill layer 129 on the second surface area 110a-A2 between the interposer module 120 and the package substrate 110, wherein the outermost edge P129 of the package underfill layer 129 may be located at an outermost edge $P_{110a\text{-}A2}$ of the second surface area 110a-A2. In one embodiment, a size of the second surface area 110a-A2 may be greater than a size of the interposer module 120, such that the package underfill layer 129 extends beyond an outermost edge of the interposer module 120 to the outermost edge $P_{110a\text{-}A2}$ of the second surface area 110a-A2. In one embodiment, a size of the second surface area 110a-A2 may be substantially the same as a size of the interposer module 120, such that the outermost edge P129 of the package underfill layer 129 may be substantially aligned with an outermost edge of the interposer module 120. In one embodiment, a size of the second surface area 110a-A2 may be less than a size of the interposer module 120, such that an outermost edge of the interposer module 120 extends beyond the outermost edge P129 of the package underfill layer 129.

Referring to FIGS. 1A-8B, a method of forming a semiconductor package 100 may include forming a package substrate 110 including an upper surface layer 110a, treating the upper surface layer 110a so that the upper surface layer 110a includes a first surface area 110a-A1 having a first surface roughness R1, and a second surface area 110a-A2 having a second surface roughness R2 less than the first surface roughness R1, and mounting an interposer module 120 in the second surface area 110a-A2 of the upper surface layer 110a of the package substrate 110.

In one embodiment, the forming of the package substrate 110 may include forming the upper surface layer 110a on a chip-side surface of the package substrate 110, and wherein the treating of the upper surface layer 110a may include roughening the upper surface layer 110a to form the first surface area 110a-A1. In one embodiment, the roughening of the upper surface layer 110a may include one of plasma treating the upper surface layer to form the first surface area 110a-A1, or pressing a mold 200a onto the upper surface layer 110a to form the first surface area 110a-A1. In one embodiment, the method may further include forming a package underfill layer 129 on the second surface area 110a-A2 between the interposer module 120 and the package substrate 110, wherein the outermost edge P129 of the package underfill layer 129 may be located at an outermost edge $P_{110a\text{-}A2}$ of the second surface area 110a-A2.

Referring to FIGS. 1A-8B, an interposer module 720 may include an interposer 122 including an upper surface layer 122a including a first surface area 122a-A1 having a first surface roughness R1, and a second surface area 122a-A2 having a second surface roughness R2 less than the first surface roughness R1, and a semiconductor device 143, 144, 145, 146 mounted in the second surface area 122a-A2 of the upper surface layer 122a of the interposer 122.

In one embodiment, the second surface area 122a-A2 may include a bump joint area including a plurality of solder joints 128 for electrically connecting the semiconductor device 143, 144, 145, 146 to the interposer 122. In one embodiment, the second surface area 122a-A2 may be surrounded by the first surface area 122a-A1. In one embodiment, the first surface roughness R1 may be greater than 1.5 times the second surface roughness R2. In one embodiment, a ratio of the second surface area 122a-A2 to a total surface area of the upper surface layer 122a may be in a range from 0.10 to 0.90. In one embodiment, the interposer module 720 may further include an interposer underfill layer 149 on the second surface area 122a-A2 between the semiconductor device 143, 144, 145, 146 and the interposer 122, wherein the outermost edge P149 of the interposer underfill layer 149 may be located at an outermost edge P122a-A2 of the second surface area 122a-A2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a package substrate including an upper surface layer comprising:
        a first surface area having a first surface roughness; and
        a second surface area having a second surface roughness less than the first surface roughness;
    an interposer module mounted on the upper surface layer of the package substrate in the second surface area, wherein a center of the interposer module is substantially aligned with a center of the second surface area, and an outermost edge of the second surface area is one of substantially aligned with an outermost edge of the interposer module or located under the interposer module; and
    a package underfill layer on the second surface area between the interposer module and the package substrate, wherein an outer sidewall of the package underfill layer extends from a bottom surface of the interposer module to the outermost edge of the second surface area.

2. The semiconductor package of claim 1, wherein the second surface area comprises a bump joint area including a plurality of solder joints for electrically connecting the interposer module to the package substrate.

3. The semiconductor package of claim 1, wherein the second surface area is surrounded by the first surface area, and the first surface roughness is greater than 1.5 times the second surface roughness.

4. The semiconductor package of claim 1, wherein the upper surface layer comprises one of a solder resist (SR) layer, a polybenzobisoxazole (PBO) layer, or a polyimide (PI) layer.

5. The semiconductor package of claim 1, wherein the second surface area comprises a plurality of second surface areas that are each surrounded by the first surface area.

6. The semiconductor package of claim 1, wherein a ratio of the second surface area to a total surface area of the upper surface layer is in a range from 0.10 to 0.90.

7. The semiconductor package of claim 1, wherein a size of the second surface area is substantially a same as a size of the interposer module, such that the outer sidewall of the package underfill layer is substantially aligned with the outermost edge of the interposer module.

8. The semiconductor package of claim 1, wherein a size of the second surface area is less than a size of the interposer module, such that the outermost edge of the interposer module extends beyond the outer sidewall of the package underfill layer.

9. The semiconductor package of claim 1, wherein the outermost edge of the second surface area is located under the semiconductor device and the outer sidewall of the package underfill layer has a concave shape.

10. The semiconductor package of claim 1, wherein the first surface area is around the second surface area and contacts an entire periphery of the second surface area.

11. The semiconductor package of claim 10, wherein the outer sidewall of the package underfill layer is aligned with an interface between the first surface area and the second surface area around the entire periphery of the second surface area.

12. The semiconductor package of claim 1, wherein a size of the second surface area is one of:
    equal to a size of the interposer module such that the outer sidewall of the package underfill layer is aligned with the outermost edge of the interposer module; or
    less than a size of the interposer module such that the outermost edge of the interposer module extends beyond the outer sidewall of the package underfill layer.

13. A method of forming a semiconductor package, the method comprising:
    forming a package substrate including an upper surface layer;
    treating the upper surface layer to provide a first surface area having a first surface roughness and a second surface area having a second surface roughness less than the first surface roughness;
    mounting an interposer module in the second surface area of the upper surface layer of the package substrate such that a center of the interposer module is substantially aligned with a center of the second surface area, and an outermost edge of the second surface area is one of substantially aligned with an outermost edge of the interposer module or located under the interposer module;
    dispensing an underfill material onto an outer portion of the second surface area such that the underfill material is drawn in between the interposer module and the package substrate; and
    curing the underfill material to form a package underfill layer having an outer sidewall extending from a bottom surface of the interposer module to the outermost edge of the second surface area.

14. The method of claim 13, wherein the forming of the package substrate comprises forming the upper surface layer on a chip-side surface of the package substrate, and wherein the treating of the upper surface layer comprises roughening the upper surface layer to form the first surface area.

15. The method of claim 14, wherein the roughening of the upper surface layer comprises one of plasma treating the upper surface layer to form the first surface area, or pressing a mold onto the upper surface layer to form the first surface area.

16. An interposer module, comprising:
    an interposer including an upper surface layer comprising:
        a first surface area having a first surface roughness; and
        a second surface area having a second surface roughness less than the first surface roughness;
    a semiconductor device mounted in the second surface area of the upper surface layer of the interposer, wherein a center of the semiconductor device is substantially aligned with a center of the second surface area and an outermost edge of the second surface area is one of substantially aligned with an outermost edge of the semiconductor device or located under the semiconductor device; and
    an interposer underfill layer on the second surface area between the semiconductor device and the interposer, wherein an outer sidewall of the interposer underfill layer extends from a bottom surface of the semiconductor device to the outermost edge of the second surface area.

17. The interposer module of claim 16, wherein the second surface area comprises a bump joint area including a plurality of solder joints for electrically connecting the semiconductor device to the interposer.

18. The interposer module of claim 16, wherein the second surface area is surrounded by the first surface area.

19. The interposer module of claim 16, wherein the first surface roughness is greater than 1.5 times the second surface roughness.

20. The interposer module of claim 16, wherein a ratio of the second surface area to a total surface area of the upper surface layer is in a range from 0.10 to 0.90.

* * * * *